(12) United States Patent
Yen et al.

(10) Patent No.: US 9,373,673 B2
(45) Date of Patent: *Jun. 21, 2016

(54) 3-D INDUCTOR AND TRANSFORMER

(71) Applicant: Taiwan Semiconductor Manufacturing Company, Ltd., Hsin-Chu (TW)

(72) Inventors: Hsiao-Tsung Yen, Tainan (TW); Chin-Wei Kuo, Zhubei (TW); Hsien-Pin Hu, Zhubei (TW); Sally Liu, Hsin-Chu (TW); Ming-Fa Chen, Taichung (TW); Jhe-Ching Lu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/719,115

(22) Filed: May 21, 2015

(65) Prior Publication Data

US 2015/0255531 A1    Sep. 10, 2015

Related U.S. Application Data

(63) Continuation of application No. 13/925,558, filed on Jun. 24, 2013, now Pat. No. 9,059,026, which is a continuation of application No. 12/791,705, filed on Jun. 1, 2010, now Pat. No. 8,471,358.

(51) Int. Cl.
*H01L 49/02* (2006.01)
*H01F 17/00* (2006.01)
(Continued)

(52) U.S. Cl.
CPC ............ *H01L 28/10* (2013.01); *H01F 17/0006* (2013.01); *H01F 27/2804* (2013.01); *H01L 21/283* (2013.01); *H01L 23/49816* (2013.01); *H01L 23/49827* (2013.01); *H01L 23/5227* (2013.01); *H01L 23/645* (2013.01); *H01L 24/16* (2013.01); *H01L 2224/0401* (2013.01); *H01L 2224/05572* (2013.01); *H01L 2224/16225* (2013.01); *H01L 2924/00014* (2013.01);
(Continued)

(58) Field of Classification Search
CPC .............................. H01L 28/10; H01L 21/283
See application file for complete search history.

(56) References Cited

U.S. PATENT DOCUMENTS 5,391,917 A    2/1995    Gilmour et al.
5,510,298 A    4/1996    Redwine
(Continued)

FOREIGN PATENT DOCUMENTS

CN    1416579 A    5/2003
CN    101202151 A    6/2008
(Continued)

*Primary Examiner* — Matthew Reames
(74) *Attorney, Agent, or Firm* — Slater Matsil, LLP

(57) ABSTRACT

In accordance with an embodiment, a semiconductor device comprises a semiconductor die, an interposer, and conductive bumps bonding the semiconductor die to the interposer. The semiconductor die comprises a first metallization layer, and the first metallization layer comprises a first conductive pattern. The interposer comprises a second metallization layer, and the second metallization layer comprises a second conductive pattern. Some of the conductive bumps electrically couple the first conductive pattern to the second conductive pattern to form a coil. Other embodiments contemplate other configurations of coils, inductors, and/or transformers, and contemplate methods of manufacture.

20 Claims, 21 Drawing Sheets

(51) Int. Cl.
  *H01L 23/498* (2006.01)
  *H01L 23/522* (2006.01)
  *H01L 23/64* (2006.01)
  *H01F 27/28* (2006.01)
  *H01L 21/283* (2006.01)
  *H01L 23/00* (2006.01)

(52) U.S. Cl.
  CPC ............... *H01L2924/01322* (2013.01); *H01L 2924/12042* (2013.01); *H01L 2924/15311* (2013.01)

(56) References Cited

U.S. PATENT DOCUMENTS

| | | | |
|---|---|---|---|
| 5,541,135 | A | 7/1996 | Pfeifer et al. |
| 5,767,001 | A | 6/1998 | Bertagnolli et al. |
| 5,998,292 | A | 12/1999 | Black et al. |
| 6,008,102 | A | 12/1999 | Alford et al. |
| 6,184,060 | B1 | 2/2001 | Siniaguine |
| 6,322,903 | B1 | 11/2001 | Siniaguine et al. |
| 6,417,754 | B1 | 7/2002 | Bernhardt et al. |
| 6,445,271 | B1 | 9/2002 | Johnson |
| 6,448,168 | B1 | 9/2002 | Rao et al. |
| 6,465,892 | B1 | 10/2002 | Suga |
| 6,472,293 | B1 | 10/2002 | Suga |
| 6,480,086 | B1 | 11/2002 | Kluge et al. |
| 6,498,557 | B2 | 12/2002 | Johnson |
| 6,538,333 | B2 | 3/2003 | Kong |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,744,114 | B2 | 6/2004 | Dentry et al. |
| 6,798,327 | B2 | 9/2004 | Yu et al. |
| 6,800,533 | B1 | 10/2004 | Yeo et al. |
| 6,800,930 | B2 | 10/2004 | Jackson et al. |
| 6,841,883 | B1 | 1/2005 | Farnworth et al. |
| 6,878,633 | B2 | 4/2005 | Raskin et al. |
| 6,882,030 | B2 | 4/2005 | Siniaguine |
| 6,924,551 | B2 | 8/2005 | Rumer et al. |
| 6,962,867 | B2 | 11/2005 | Jackson et al. |
| 6,962,872 | B2 | 11/2005 | Chudzik et al. |
| 7,030,481 | B2 | 4/2006 | Chudzik et al. |
| 7,049,170 | B2 | 5/2006 | Savastiouk et al. |
| 7,060,601 | B2 | 6/2006 | Savastiouk et al. |
| 7,071,546 | B2 | 7/2006 | Fey et al. |
| 7,111,149 | B2 | 9/2006 | Eilert |
| 7,122,912 | B2 | 10/2006 | Matsui |
| 7,157,787 | B2 | 1/2007 | Kim et al. |
| 7,164,339 | B2 | 1/2007 | Huang |
| 7,170,384 | B2 | 1/2007 | Kim et al. |
| 7,193,308 | B2 | 3/2007 | Matsui |
| 7,262,495 | B2 | 8/2007 | Chen et al. |
| 7,297,574 | B2 | 11/2007 | Thomas et al. |
| 7,335,972 | B2 | 2/2008 | Chanchani |
| 7,354,798 | B2 | 4/2008 | Pogge et al. |
| 7,355,273 | B2 | 4/2008 | Jackson et al. |
| 7,518,248 | B2 | 4/2009 | Li et al. |
| 7,843,303 | B2 | 11/2010 | Lu et al. |
| 7,932,590 | B2 | 4/2011 | Lam |
| 7,990,220 | B2 | 8/2011 | Kondo et al. |
| 8,314,496 | B2 | 11/2012 | Chen |
| 8,416,047 | B2 | 4/2013 | Weekamp et al. |
| 8,471,358 | B2 * | 6/2013 | Yen ................... H01L 23/49822 257/531 |
| 8,598,715 | B2 | 12/2013 | Chen |
| 9,059,026 | B2 * | 6/2015 | Yen ........................ H01L 28/10 |
| 2003/0034867 | A1 | 2/2003 | Berthold et al. |
| 2006/0267216 | A1 | 11/2006 | Li et al. |
| 2008/0054428 | A1 | 3/2008 | Lam |
| 2008/0061418 | A1 | 3/2008 | Enquist et al. |
| 2008/0061420 | A1 | 3/2008 | Degani et al. |
| 2008/0197491 | A1 | 8/2008 | Matsui |
| 2008/0296697 | A1 | 12/2008 | Hsu et al. |
| 2009/0090995 | A1 | 4/2009 | Yang et al. |
| 2009/0243035 | A1 | 10/2009 | Mashino |
| 2010/0109133 | A1 | 5/2010 | Ito et al. |
| 2010/0117737 | A1 | 5/2010 | Kondo et al. |
| 2010/0141370 | A1 | 6/2010 | Lu et al. |
| 2010/0265030 | A1 | 10/2010 | Weekamp et al. |
| 2010/0308470 | A1 | 12/2010 | Chen |
| 2011/0233776 | A1 | 9/2011 | Lee et al. |
| 2013/0020675 | A1 | 1/2013 | Kireev et al. |
| 2013/0147023 | A1 | 6/2013 | Lin et al. |
| 2014/0021591 | A1 | 1/2014 | Sung et al. |
| 2014/0264734 | A1 | 9/2014 | Luo et al. |

FOREIGN PATENT DOCUMENTS

| | | |
|---|---|---|
| CN | 101315914 A | 12/2008 |
| EP | 0725407 A1 | 7/1996 |

\* cited by examiner

3-D INDUCTOR AND TRANSFORMER

This application is a continuation of U.S. patent application Ser. No. 13/925,558, filed Jun. 24, 2013, and entitled "3-D Inductor and Transformer," which is a continuation of U.S. patent application Ser. No. 12/791,705, filed Jun. 1, 2010, and entitled "3D Inductor and Transformer," which applications are hereby incorporated herein by reference.

TECHNICAL FIELD

The present disclosure relates generally to a three-dimensional (3-D) inductor and method of manufacture and, more particularly, to a 3-D inductor and/or transformer using an interposer in semiconductor packaging and method of manufacture.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2-D) in nature, in that the volume occupied by the integrated components is essentially on the surface of the semiconductor wafer. Although dramatic improvement in lithography has resulted in considerable improvement in 2-D IC formation, there are physical limits to the density that can be achieved in two dimensions. One of these limits is the minimum size needed to make these components. Also, when more devices are put into one chip, more complex designs are required.

Particularly in radio frequency (RF) and mixed signal designs, inductors and transformers are commonly used. However, the 2-D integration of these components generally requires a large amount of chip area in the IC product. Further, because of the general desire to reduce these feature sizes, the metal lines in these components may decrease in size, thus increasing the resistance in the metal lines. The increased resistance may in turn lower the quality (Q) factor of these inductors and transformers. Also, having inductors and transformers on the chip or die may cause the magnetic flux of the inductors and transformers to pass through the chip. The magnetic flux may couple with devices in the chip, such as transistors, metal lines, and/or interconnects to create unwanted noise. Accordingly, there is a need in the art to overcome these stated deficiencies.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 6A through 6H illustrate various views of a portion of a 3-D structure in accordance with a further embodiment;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a three-dimensional (3-D) semiconductor structure and/or package with an interposer that includes an inductor and/or transformer. Other embodiments may also be applied, however, to other 3-D structures.

Figure 1:
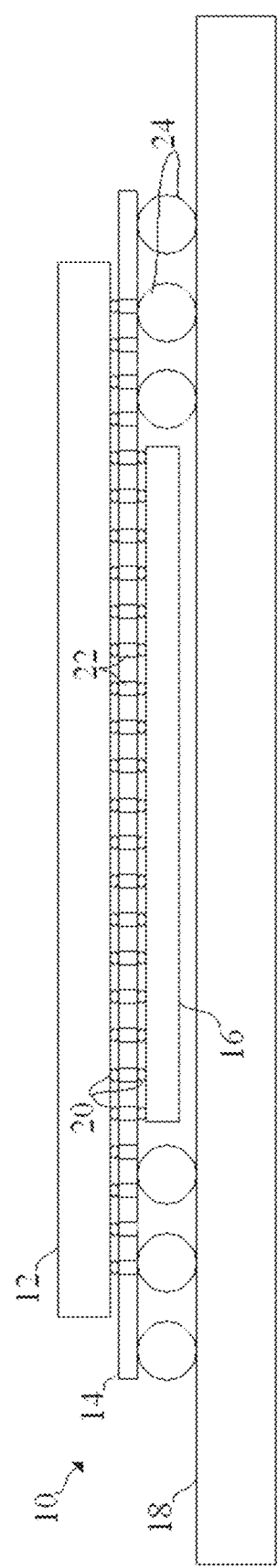
FIG. 1 is a 3-D structure using an interposer according to an embodiment.

FIG. 1 illustrates a 3-D structure 10 comprising an inductor and/or transformer using an interposer 14 according to an embodiment. In FIG. 1, there is shown a cross-section view of an interposer 14 with a first integrated circuit die 12 attached to a first side of the interposer 14 via conductive bumps 20 and a second integrated circuit die 16 attached to a second side of the interposer 14 via conductive bumps 20 in accordance with an embodiment. The conductive bumps 20 may include bumps, balls, pillars, columns, or the like, and may comprise, for example, microbumps having a diameter of about 5 micrometers to about 50 micrometers.

The interposer 14 is further attached to a substrate 18, which may be, for example, a packaging substrate, another die/wafer, a printed-circuit board, a high-density interconnect, or the like. Through substrate vias (TSVs) 22 in the interposer 14 provide an electrical connection between the first integrated circuit die 12 and the second integrated circuit die 16, as well as between the substrate 18 and one or both of the first integrated circuit die 12 and the second integrated circuit die 16 via conductive bumps 24. The substrate 18 may comprise further TSVs, conductive bumps, and/or components, and may be further coupled to other substrates.

The first integrated circuit die 12 and the second integrated circuit die 16 may be any suitable integrated circuit die for a particular application. For example, one of the first integrated circuit die 12 and the second integrated circuit die 16 may be a radio-frequency (RF) chip such as an RF/mixed signal integrated circuit, an RF/mixed signal micro-electrical mechanical system (HEMS) design, or the like.

Figure 2A:
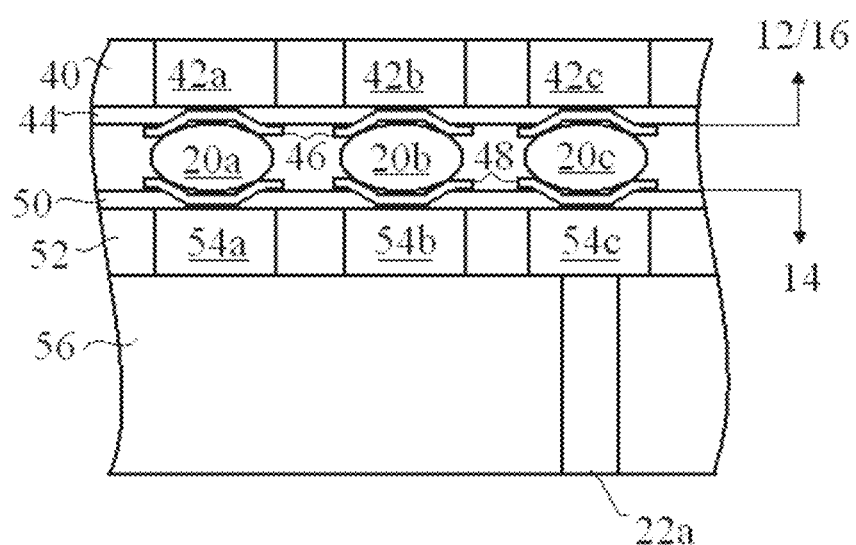
FIGS. 2A through 2D illustrate various views of a portion of a 3-D structure in accordance with an embodiment.
Figure 2B:
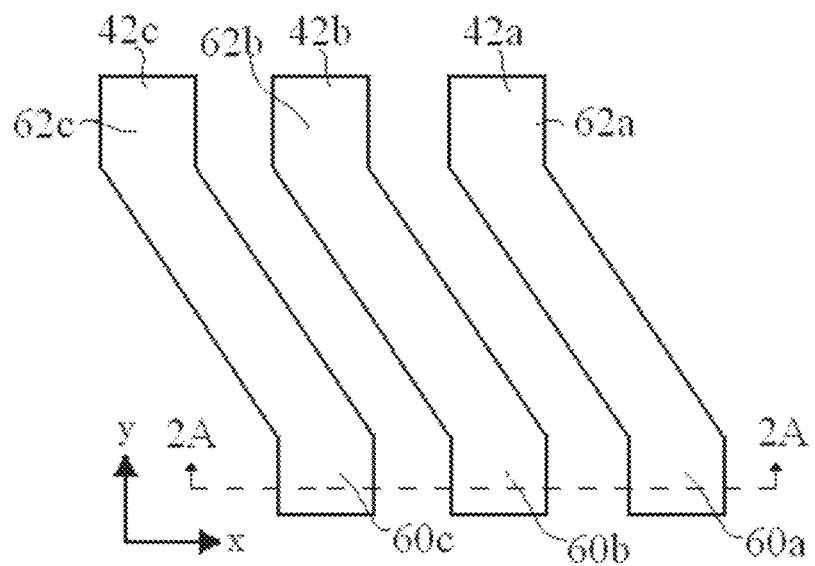
Figure 2C:
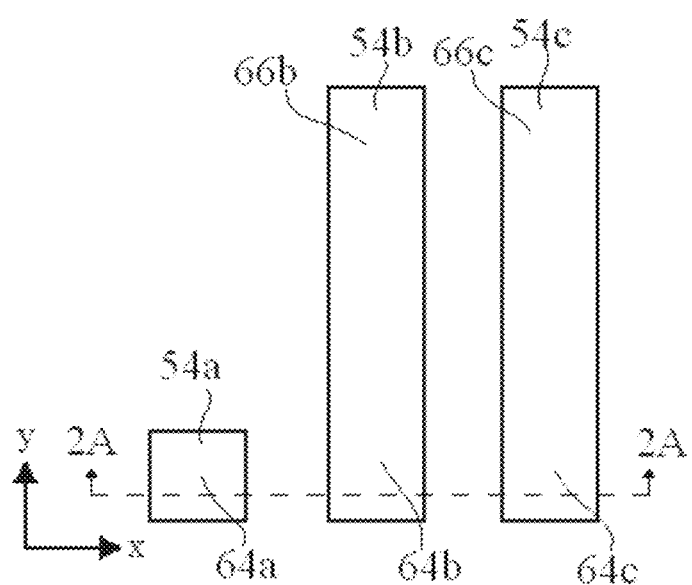
Figure 2D:
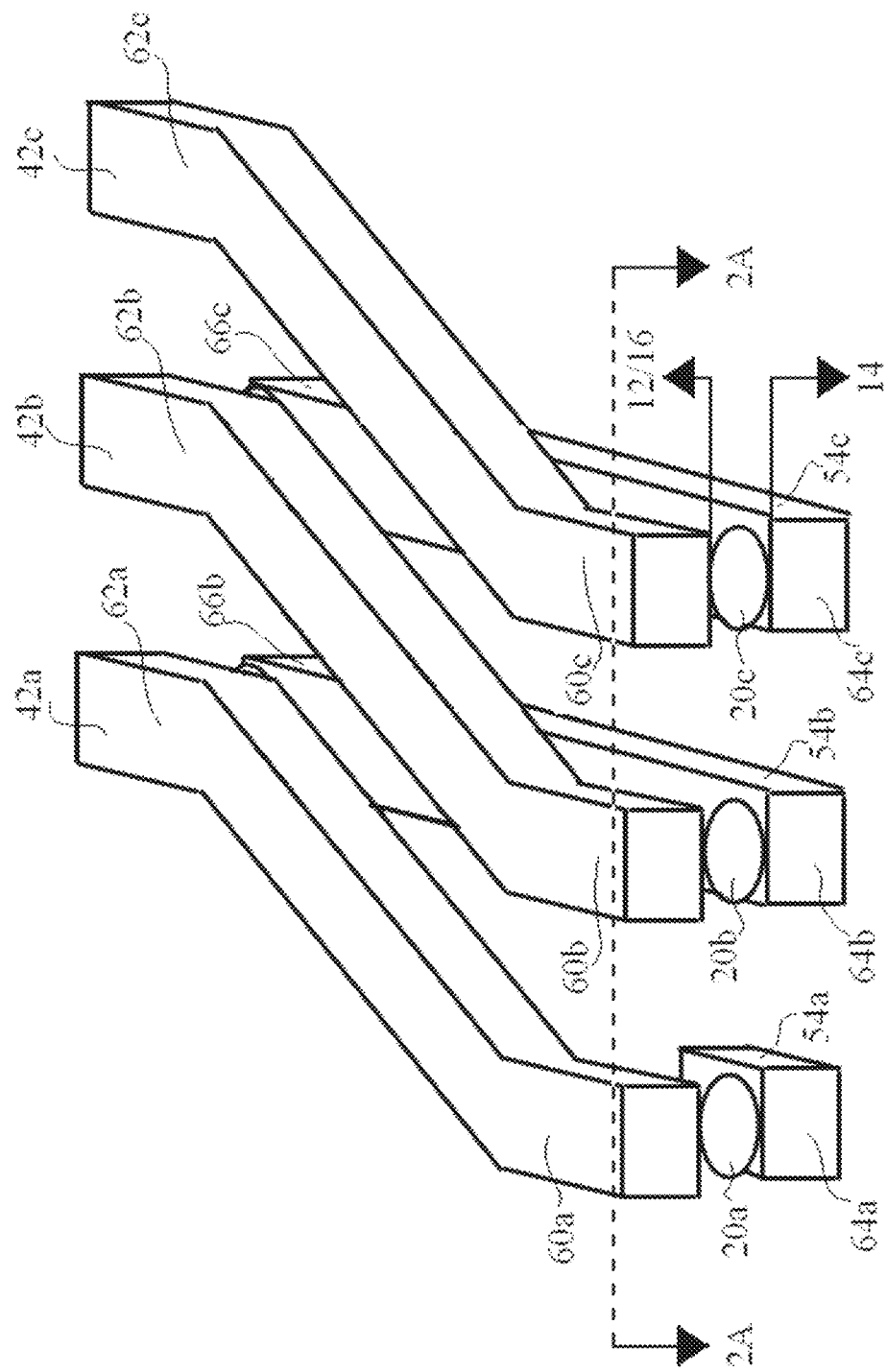

FIGS. 2A through 2D illustrate various views of a portion of a 3-D structure illustrated in FIG. 1 in accordance with an embodiment, wherein the portion comprises a coil, or an inductor. These FIGS. 2A through 2D may be referenced between descriptions of each other. FIG. 2D is a simplified 3-D view of the portion of the 3-D structure, and FIGS. 2A through 2C are various 2-D views. In particular, FIG. 2B is a plan view of a first conductive pattern 42 in the integrated circuit die 12/16, and FIG. 2C is a plan view of a second conductive pattern 54 in the interposer 14. FIG. 2A is a cross-sectional view taken along the 2A-2A line illustrated in FIGS. 2B through 2D.

FIG. 2A shows either the first integrated circuit die 12 or the second integrated circuit die 16 (referenced as the "integrated circuit die 12/16") and the interposer 14. The integrated circuit die 12/16 comprises a top metallization layer 40 in which first trace links 42a, 42b, and 42c (collectively referenced as "first conductive pattern 42") are patterned. The top metallization layer 40 may be any dielectric layer, such as borophosphosilicate glass (BPSG), silicon oxide, silicon nitride, silicon oxynitride, undoped silicate glass (USG), any combination thereof, or the like. The first conductive pattern 42 may be any conductive material, such as copper, nickel, aluminum, tungsten, titanium, any combination thereof, or the like. The top metallization layer 40 is covered by a passivation layer 44. The passivation layer 44 may be silicon oxide, silicon nitride, silicon oxynitride, any combination thereof, or the like. Underbump metal pads 46 are formed through openings in the passivation layer 44 over the first conductive pattern 42. The underbump metal pads 46 may be a metal(s), such as copper, nickel, tungsten, titanium, gold, combinations thereof, or the like. Conductive bumps 20a, 20b, and 20c (collectively referenced as 20) are formed on the underbump metal pads 46. Conductive bumps 20 may be lead free solder, eutectic lead, conductive pillars (such as copper pillars), or the like.

FIG. 2A further shows a front-side metallization layer 52 of the interposer 14 over a substrate 56, which may be silicon and may have a thickness of approximately 50 micrometers. Second trace links 54a, 54b, and 54c (collectively referenced as "second conductive pattern 54") are patterned into the front-side metallization layer 52. A passivation layer 50 is over the front-side metallization layer 52, and underbump metal pads 48 are formed through the passivation layer 50 over the second conductive pattern 54. The front-side metallization layer 52 may be any dielectric layer, such as BPSG, silicon oxide, silicon nitride, silicon oxynitride, USG, any combination thereof, or the like. The second conductive pattern 54 may be any conductive material, such as copper, nickel, aluminum, tungsten, titanium, any combination thereof, or the like. The passivation layer 50 may be silicon oxide, silicon nitride, silicon oxynitride, any combination thereof, or the like. An optional TSV 22a is illustrated as coupling to the second trace link 54c. TSV 22a may couple the structure to another integrated circuit die, the substrate 18, and/or other components. It should also be noted that the top metallization layer 40 in the integrated circuit die 12/16 and front-side metallization layer 52 in the interposer 14 may be any metallization layer with any interconnect structures between the metallization layer 40 or 52 and the underbump metal pads 46 or 48. The metallization layers 40 and 52 are illustrated as the top layer solely for simplicity of depiction and description.

FIG. 2B is a plan view of the first conductive pattern 42 in the integrated circuit die 12/16. FIG. 2B also depicts a line 2A-2A indicating the cross-section viewed in FIG. 2A. Each of the first trace links 42a, 42b, and 42c extend longitudinally in two directions. For example, first trace link 42a extends substantially only in the y-direction near the opposing ends 60a and 62a of the first trace link 42a, but extends in a direction angled from the y-axis, thus extending with both x and y-directional components, in other areas of the first trace link 42a. First trace links 42b and 42c are similarly patterned with opposing ends 60b, 60c, 62b, and 62c.

FIG. 2C is a plan view of the second conductive pattern 54 in the interposer 14. FIG. 2C depicts a line 2A-2A to indicate the cross-section viewed in FIG. 2A. Each of the second trace links 54a, 54b, and 54c extends longitudinally in the y-direction. Second trace link 54a comprises end 64a, and second trace links 54b and 54c comprise ends 64b and 66b, and 64c and 66c, respectively.

FIG. 2D is a simplified 3-D view of the first conductive pattern 42 in the integrated circuit die 12/16, conductive bumps 20, and the second conductive pattern 54 in the interposer 14. End 64a of second trace link 54a is coupled by conductive bump 20a to end 60a of first trace link 42a. End 62a of first trace link 42a is coupled to end 66b of second trace link 54b by a conductive bump (not shown), and end 64b of second trace link 54b is coupled by conductive bump 20b to end 60b of first trace link 42b. End 62b of first trace link 42b is coupled to end 66c of second trace link 54c by a conductive bump (not shown), and end 64c of second trace link 54c is coupled by conductive bump 20c to end 60c of first trace link 42c. In this configuration, the first conductive pattern 42, the second conductive pattern 54, and the conductive bumps 20 form an inductor. Further, as can be seen from FIG. 2D, first trace links 42a, 42b, and 42b each extend in a second direction such that each may couple a respective pair of adjacent, parallel second trace links 54a, 54b, and 54c. Thus, first trace links 42a, 42b, and 42c each may be considered a transverse link.

Figure 3A:
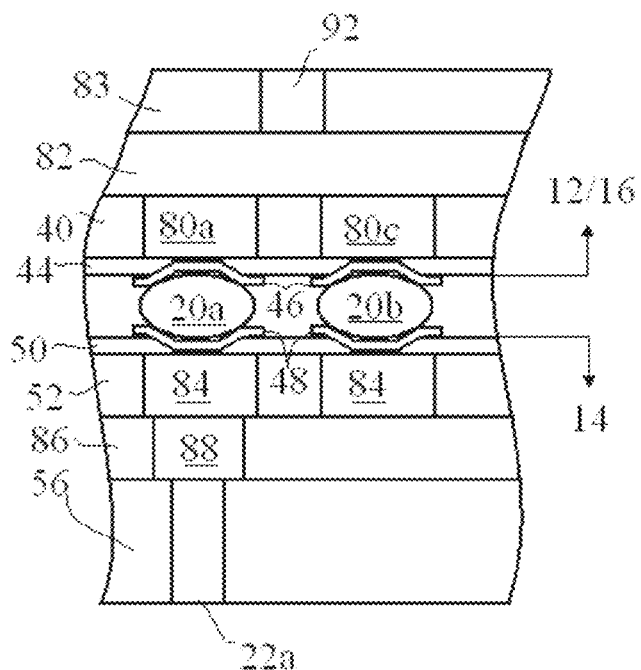
FIGS. 3A through 3D illustrate various views of a portion of a 3-D structure in accordance with another embodiment.
Figure 3B:
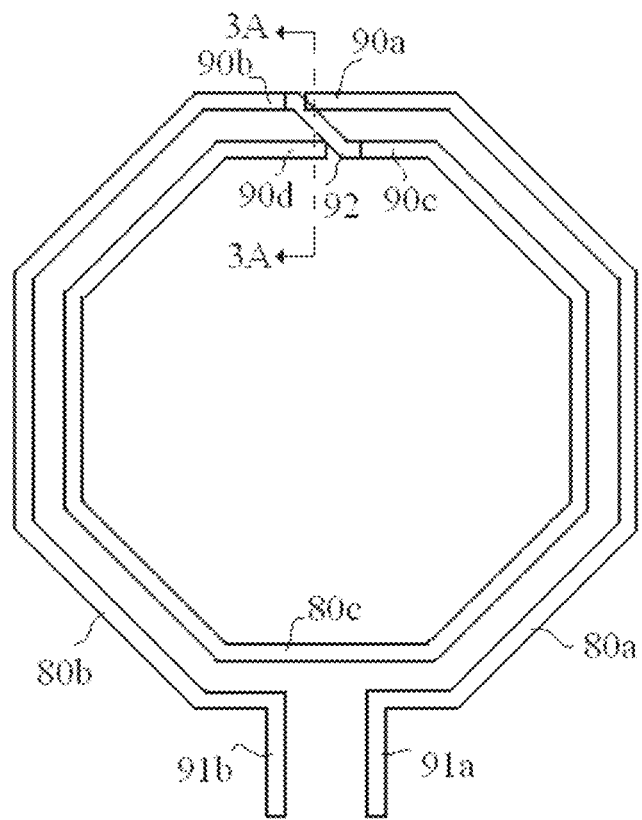
Figure 3C:
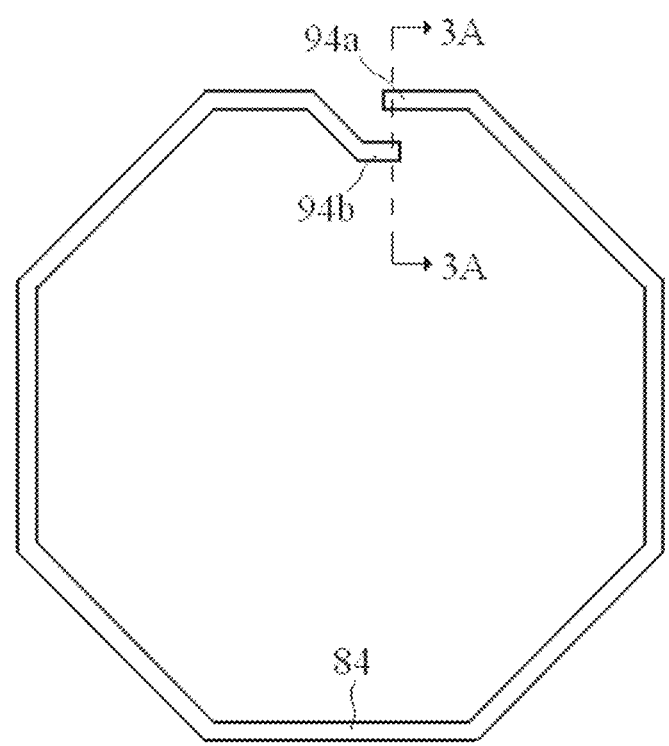
Figure 3D:
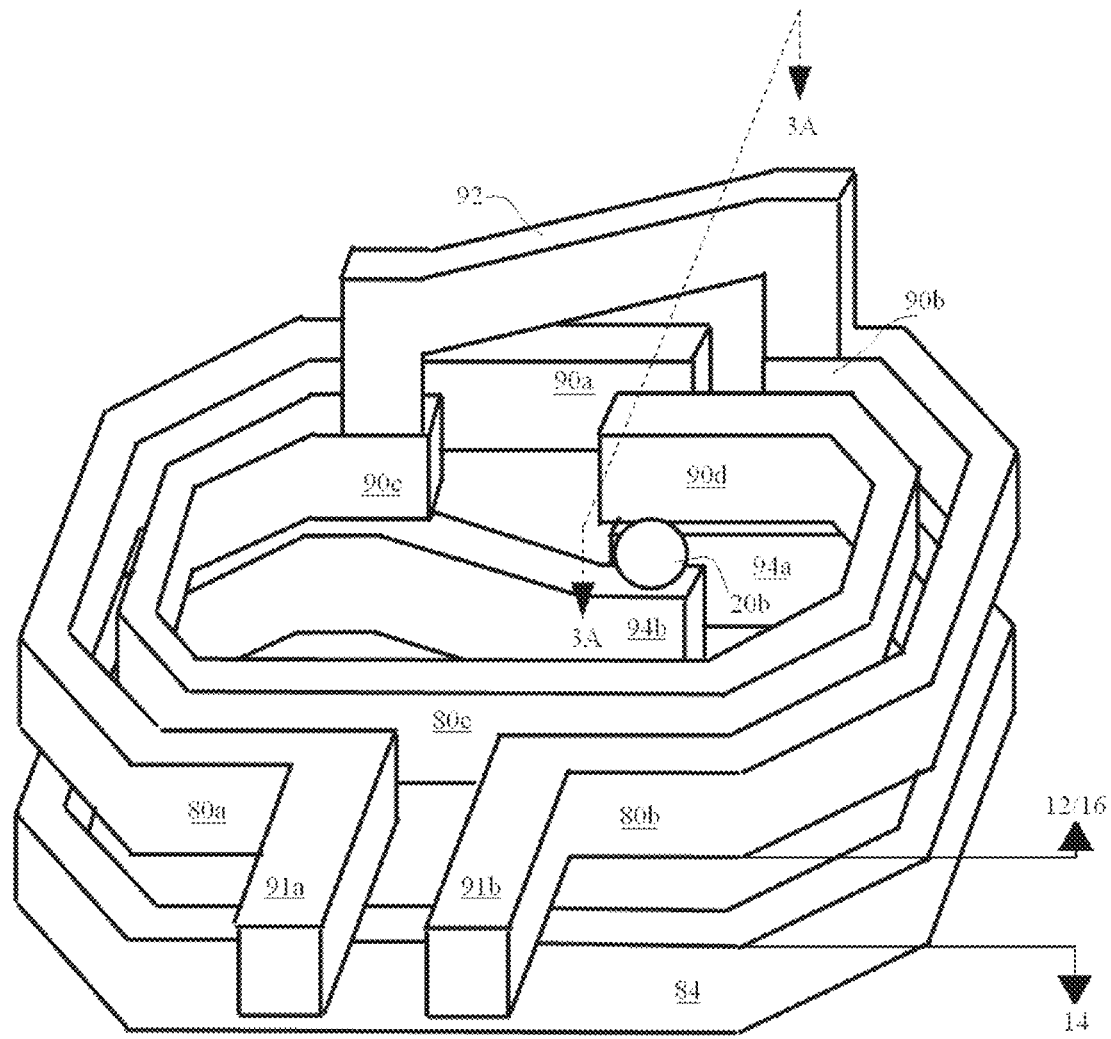

FIGS. 3A through 3D illustrate various views of a portion of a 3-D structure illustrated in FIG. 1 in accordance with another embodiment, wherein the portion comprises a coil, or an inductor, by using spiral patterns in metallization layers. These FIGS. 3A through 3D may be referenced between descriptions of each other. FIG. 3D is a simplified 3-D view of the portion of the 3-D structure, and FIGS. 3A through 3C are various 2-D views. In particular, FIG. 3B is a plan view of a first conductive pattern 80 in the integrated circuit die 12/16, and FIG. 3C is a plan view of a second conductive pattern 84 in the interposer 14. FIG. 3A is a cross-sectional view taken along the 3A-3A line illustrated in FIGS. 3B through 3D.

FIG. 3A is a cross-sectional view and further illustrates parts of a first half of an outer ring 80a, a second half of the outer ring 80b, and an inner ring 80c (collectively referenced as "first conductive pattern 80") in the top metallization layer 40, a first metallization layer 82 below the top metallization layer 40, and a second metallization layer 83 with a cross link 92 below the first metallization layer 82 in the integrated circuit die 12/16. FIG. 3A also shows parts of a ring 84 (also referenced as "second conductive pattern 84") in the front-side metallization layer 52, an additional front-side metallization layer 86 under the front-side metallization layer 52, and an interconnect structure 88 coupling the second conductive pattern 84 to the optional TSV 22a in the interposer 14.

The 3-D structure will now be described with reference to the plan view of the first conductive pattern 80 in the integrated circuit die 12/16 as shown in FIG. 3B, the plan view of the second conductive pattern 84 in the interposer 14 as illustrated in FIG. 3C, and the simplified 3-D illustration in FIG. 3D. With reference to FIGS. 3B and 3D, the first conductive pattern 80 forms a double ring in the shape of an octagon. The double ring starts at end 91a of the first half of the outer ring 80a and extends through a half circumference of the outer ring to end 90a. At end 90a, the first half of the outer ring 80a is electrically coupled to end 94a of the ring 84 by conductive bump 20a (not specifically illustrated in FIG. 3D).

With reference to FIGS. 3C and 3D, the ring 84 begins at end 94a and extends in a ring shape of an octagon until it reaches near end 94a and crosses to an inner area to end 94b.

End 94*b* of the ring 84 is electrically coupled by conductive bump 20*b*, as shown in FIG. 3D, to end 90*d* of the inner ring 80*c* of the double ring. With reference to FIGS. 3B and 3D, beginning at end 90*d*, the inner ring 80*c* extends around the inner circumference to end 90*c*. End 90*c* of the inner ring 80*c* is then electrically coupled to end 90*b* of the second half of the outer ring 80*b* by the cross link 92. The cross link 92 may comprise interconnect structures in the first and second metallization layers 82 and 83 illustrated in FIG. 3A, but may be formed between other metallization layers. From end 90*b*, the second half of the outer ring 80*b* extends along the remaining half circumference of the outer ring to end 91*b*. Note that the shape of the ring(s) is not limited to an octagonal shape, but may also be rectangular, round, hexagonal, or the like.

In the configurations discussed with respect to FIGS. 2A through 3D, an inductor may be formed between metallization layers on an interposer and an integrated circuit die using a conductive bump as a part of the inductor coil. Using these configurations may result in an inductor that may otherwise require a larger area to be formed on the integrated circuit die. Further, using the embodiment in FIGS. 2A through 2D, the magnetic flux produced by the inductor may be directed more in a direction parallel the outer surface of the integrated circuit die on which the conductive bumps are formed, thus, reducing the magnetic flux penetrating the integrated circuit die substrate. This may reduce parasitic coupling between other devices and components on the integrated circuit die. Using the configuration in FIGS. 3A through 3D may also reduce parasitic coupling because the inductor may be further removed from other devices and components on the integrated circuit die. Another advantage of these embodiments may be that the size of the conductive materials used on the interposer may be larger and may be thicker than metals used in metallization layers on an integrated circuit die, for example the conductive materials may be 9K metal layers. Thus, these embodiments may realize a higher quality (Q) factor. Also, these embodiments may be formed more cheaply.

Figure 4:
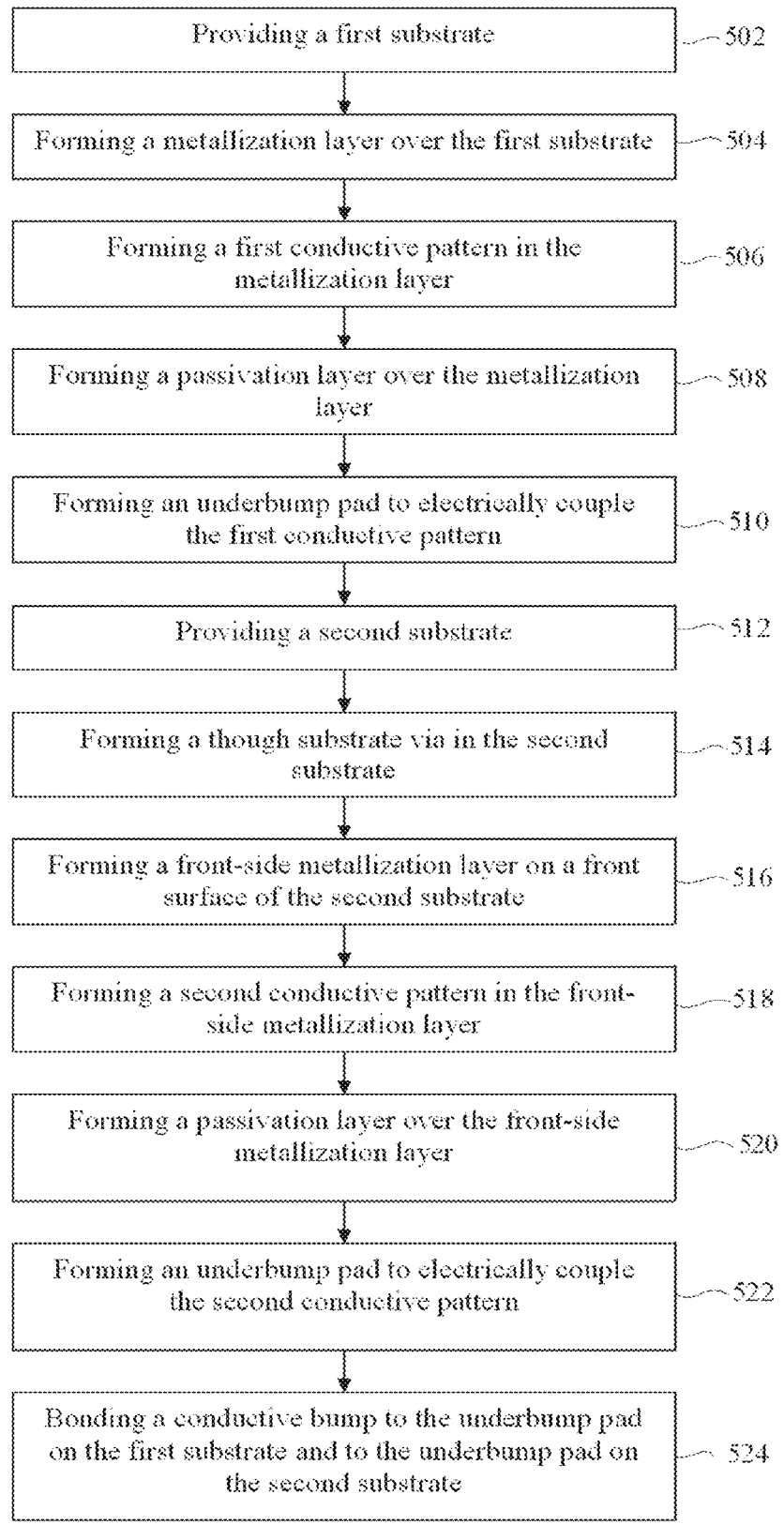
FIG. 4 is a method of forming the embodiment of FIGS. 2A through 2D according to an embodiment.

FIG. 4 is a method of forming the embodiment illustrated in FIGS. 2A through 2D. The steps discussed with regard to FIG. 4 may be performed in various sequences, and any sequence discussed herein is only for clarification of the embodiment. In step 502, a first substrate is provided. The first substrate may be an integrated circuit die, such as the first integrated circuit die 12 or the second integrated circuit die 16, during processing. For example, the first substrate may be bulk silicon with active and passive devices formed thereon with any number and combination of metallization layer dielectrics or inter-layer dielectrics (ILD) formed on the bulk silicon.

In step 504, a metallization layer is formed over the first substrate. The metallization layer may be a dielectric layer, such as BPSG, silicon oxide, silicon nitride, silicon oxynitride, USG, or the like, and may be formed using a chemical vapor deposition (CVD) technique. In step 506, a first conductive pattern is formed in the metallization layer. The pattern may be formed by using standard lithography and deposition techniques to form the pattern illustrated in FIG. 2B, for example. A damascene or dual damascene process may be used. A photoresist may be formed over the metallization layer and patterned using a lithography mask. An etch may be used to form openings in the metallization layer. The first conductive pattern may comprise conductive a material deposited in the openings using, for example, a CVD technique. The conductive material may be copper, nickel, aluminum, tungsten, titanium, combinations thereof, and/or the like. Any excess conductive material may be removed and the metallization layer may be planarized using a chemical mechanical polish (CMP).

In step 508, a passivation layer is formed over the metallization layer. Note that intervening layers, such as other metallization layers, may be formed between the metallization layer and the passivation layer. The passivation layer may be a dielectric layer, such as silicon oxide, silicon nitride, silicon oxynitride, combinations thereof, or the like, and may be formed using a CVD technique. A further passivation layer may be formed over the passivation layer using, for example, polymer based materials. In step 510, an underbump pad is formed to be electrically coupled to the first conductive pattern. This may include forming a photoresist over the passivation layer, using a lithography mask to pattern the photoresist where the underbump pad is to be formed, and etching the passivation layer to form an opening. A metal, such as copper, nickel, tungsten, titanium, gold, combinations thereof, or the like, may be conformally deposited, such as by using a CVD technique, over the passivation layer and into the opening. Excess metal may be removed by forming and patterning a photoresist and etching the exposed metals.

In step 512, a second substrate is provided. This substrate may be a bulk silicon substrate or the like. In step 514, a TSV is formed in the second substrate. For example, openings may be formed extending into the second substrate by, for example, one or more etching processes, milling, laser techniques, or the like through a front surface of the second substrate. The openings may be filled with a conductive material. The conductive material may comprise, for example, copper, tungsten, aluminum, silver, combinations thereof, or the like, formed by an electro-chemical plating process, thereby forming the TSV.

In step 516, a front-side metallization layer is formed on the front surface of the second substrate. The front-side metallization layer may be a dielectric, such as BPSG, silicon oxide, silicon nitride, silicon oxynitride, USG, or the like, and may be formed using a CVD technique. It should be noted that the front-side metallization layer may be formed adjoining the second substrate, or other layers, such as other metallization layers, may be disposed between the second substrate and the front-side metallization layer. Further, other layers, such as more metallization layers, may be formed on the front-side metallization layer. In step 518, a second conductive pattern is formed in the front-side metallization layer. The second conductive pattern may be formed by using standard lithography and deposition techniques to form the pattern illustrated in FIG. 2C, for example. A damascene or dual damascene process may be used. A photoresist may be formed over the metallization layer and patterned using a lithography mask. An etch may be used to form openings in the metallization layer. A conductive material may be deposited in the openings using, for example, a CVD technique. The conductive material may be copper, nickel, aluminum, tungsten, titanium, combinations thereof, and/or the like. Any excess conductive material may be removed and the metallization layer may be planarized using a CMP. A portion of the conductive material may be electrically coupled to the TSV formed in step 514.

In step 520, a passivation layer is formed over the front-side metallization layer. Note that intervening layers, such as other metallization layers, may be formed between the metallization layer and the passivation layer. The passivation layer may be a dielectric layer, such as silicon oxide, silicon nitride, silicon oxynitride, combinations thereof, or the like, and may be formed using a CVD technique. A further passivation layer may be formed over the passivation layer using, for example, a polymer based material. In step 522, an underbump pad is formed to be electrically coupled to the second conductive pattern. This may include forming a photoresist over the passivation layer, using a lithography mask to pattern the photoresist where the underbump pad is to be formed, and etching the passivation layer to form an opening. A metal, such as copper, nickel, tungsten, titanium, gold, combinations thereof, or the like, may be conformally deposited, such as by using a CVD technique, over the passivation layer and into the opening. Excess metal may be removed by forming and patterning a photoresist and etching the exposed metals.

In step 524, a conductive bump is bonded to the underbump pad on the first substrate formed in step 510 and to the underbump pad on the second substrate formed in step 522. This may be performed using acceptable soldering techniques, and the conductive bump may be lead free solder, eutectic lead, a copper pillar, or the like. Thus, the first substrate may be bonded to the second substrate, such as in a flip-chip configuration. The first substrate may be one of the first integrated circuit die 12 or the second integrated circuit die 16 discussed above. The second substrate may be a finished interposer 14 or an unfinished interposer in intermediate processing. For example, if the second substrate is an unfinished interposer, the second substrate may be thinned on the back surface to expose a portion of the TSV through the back surface. Metallization layers may be formed on the back surface with interconnects and other devices formed therein, and some of the interconnects and/or devices may electrically couple some of the TSVs. Another integrated circuit die may be bonded to the finished interposer, and connections between the first substrate and the integrated circuit die may be made. The interposer may also be connected to other substrates, such as a printed circuit board (PCB). Other details may be ready understood by persons having ordinary skill in the art, and are therefore omitted herein for brevity.

Figure 5:
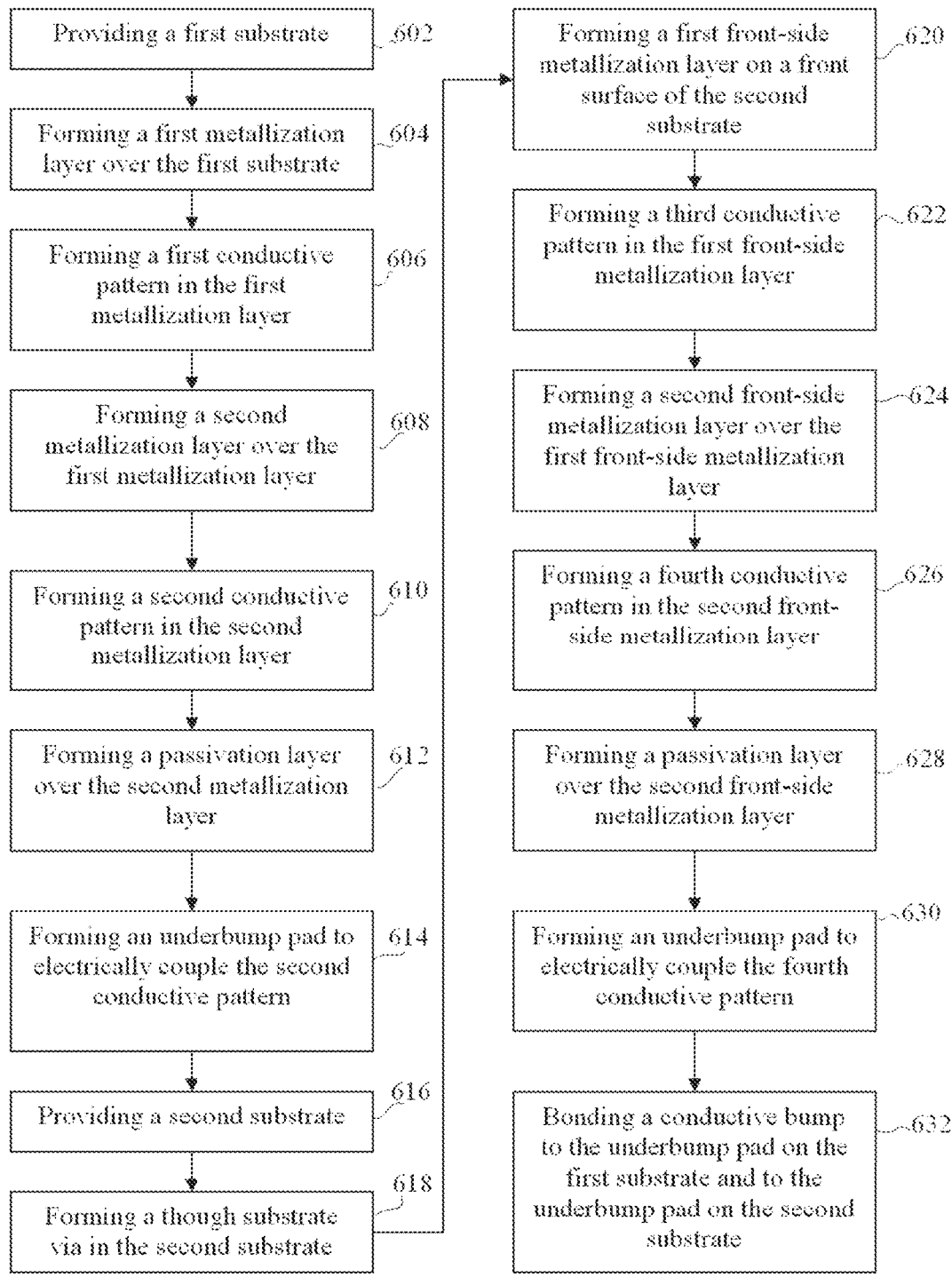
FIG. 5 is a method of forming the embodiment of FIGS. 3A through 3D according to another embodiment.

FIG. 5 is a method of forming the embodiment illustrated in FIGS. 3A through 3D. The steps discussed with regard to FIG. 5 may be performed in various sequences, and any sequence discussed herein is only for clarification of the embodiment. Further, many of the steps in FIG. 5 are similar to those discussed in conjunction with FIG. 4, and many of the details of those steps are omitted in the discussion of FIG. 5 for brevity.

In step 602, a first substrate is provided, similar to step 502 above. In step 604, a first metallization layer is formed over the first substrate, and in step 606 a first conductive pattern, such as cross link 92 in FIG. 3B, is formed. In step 608, a second metallization layer is formed over the first metallization layer, and in step 610, a second conductive pattern, such as the first conductive pattern 80 in FIG. 3B, is formed. A passivation layer is formed over the second metallization layer in step 612. In step 614, an underbump pad is formed to electrically couple the second conductive pattern through the passivation layer.

In step 616, a second substrate is provided, similar to step 512 above. In step 618, a TSV is formed in the second substrate, similar to step 514. In step 620, a first front-side metallization layer is formed on a front surface of the second substrate, and in step 622, a third conductive pattern, such as interconnect structure 88 in FIG. 3A, is formed. In step 624, a second front-side metallization layer is formed over the first front-side metallization layer, and in step 626, a fourth conductive pattern, such as the second conductive pattern 84 in FIG. 3C, is formed. A passivation layer is formed over the second front-side metallization layer in step 628. In step 630, an underbump pad is formed to electrically couple the fourth conductive pattern through the passivation layer. In step 632, a conductive bump is bonded to the underbump pad on the first substrate formed in step 614 and to the underbump pad on the second substrate formed in step 630. Further processing may be performed on the second substrate, as discussed above.

Figures 6A, 6B:
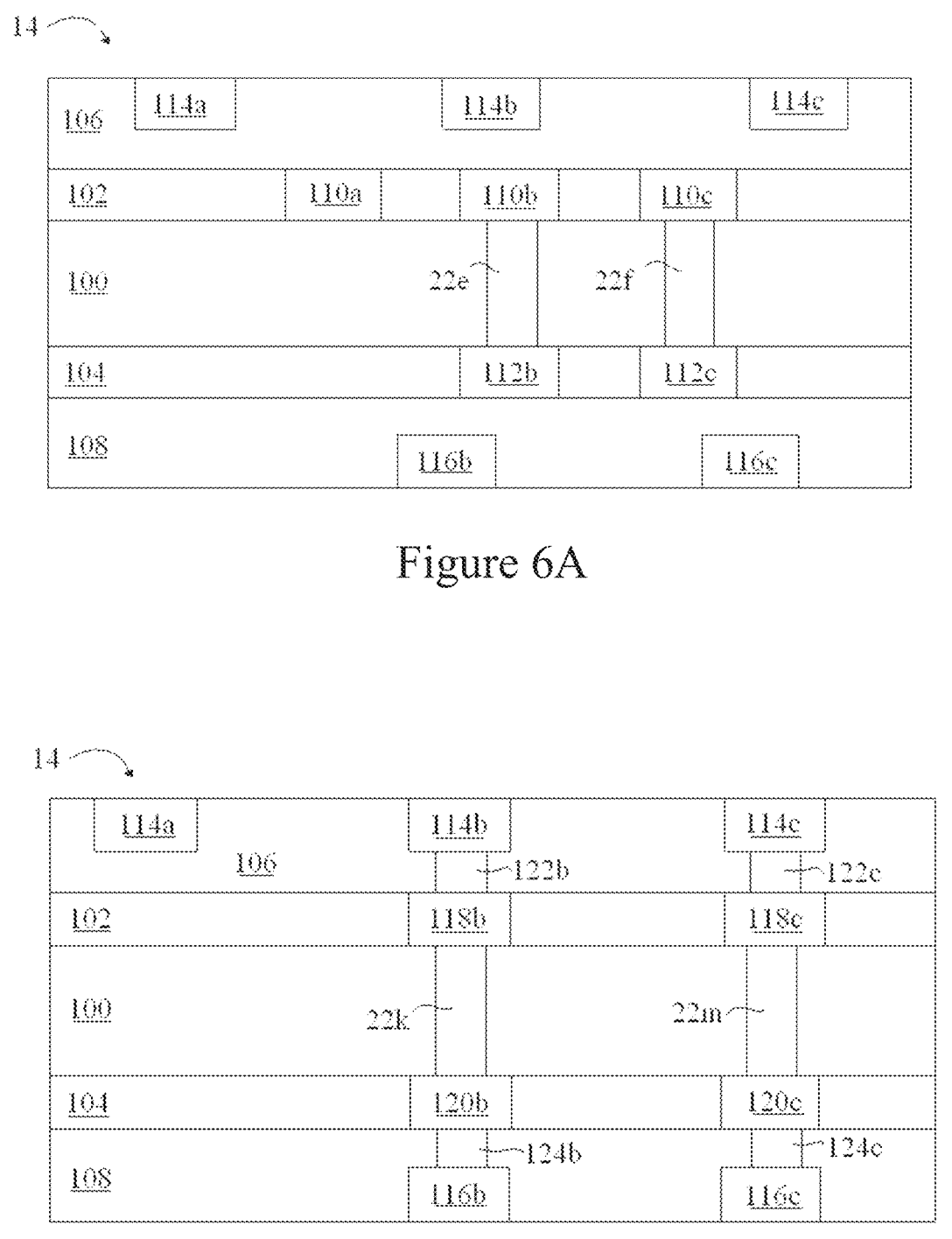
Figure 6C:
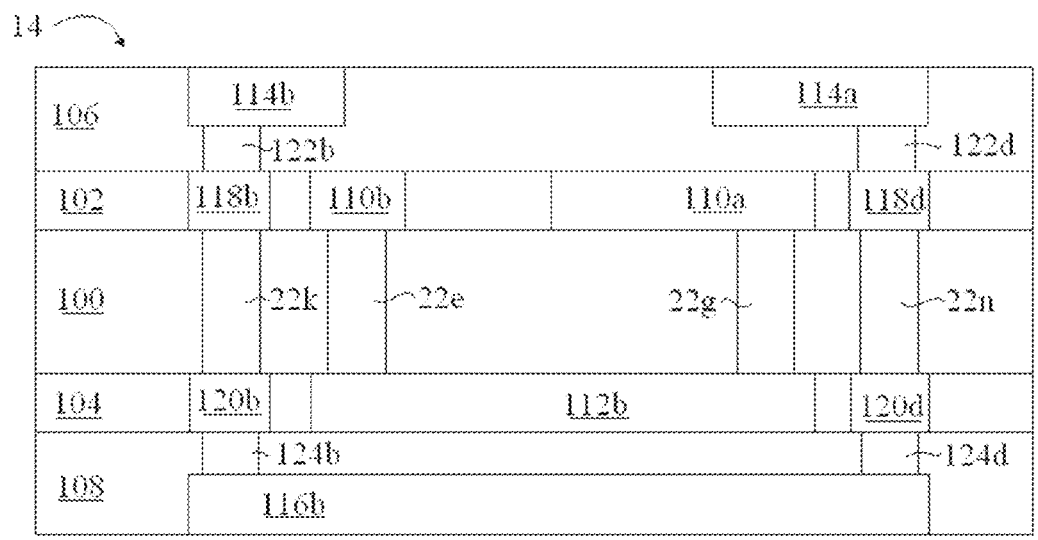
Figure 6D:
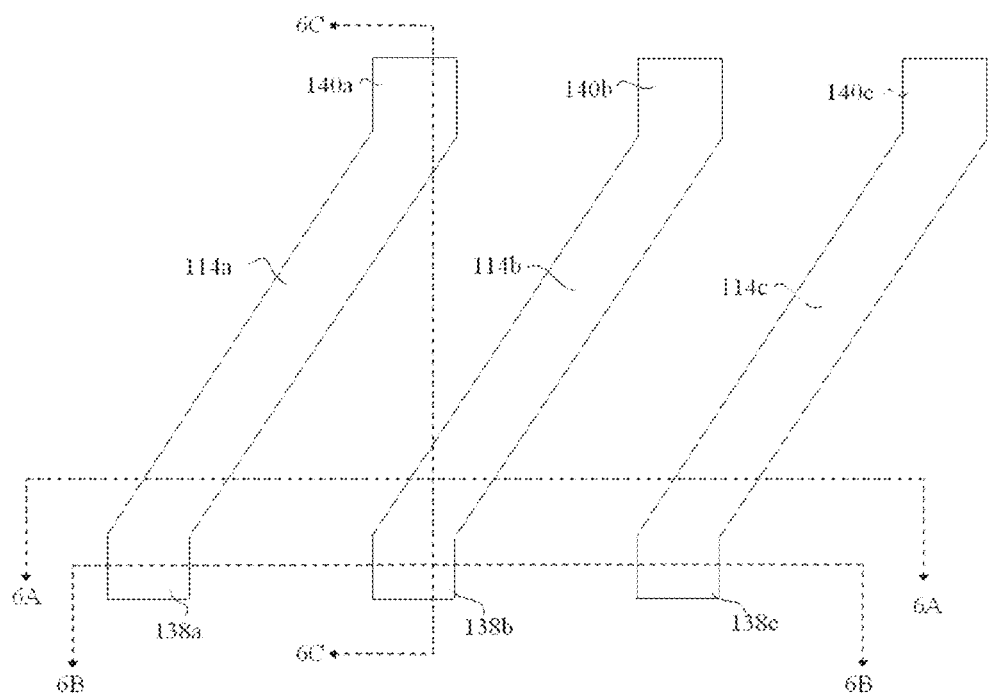
Figure 6E:
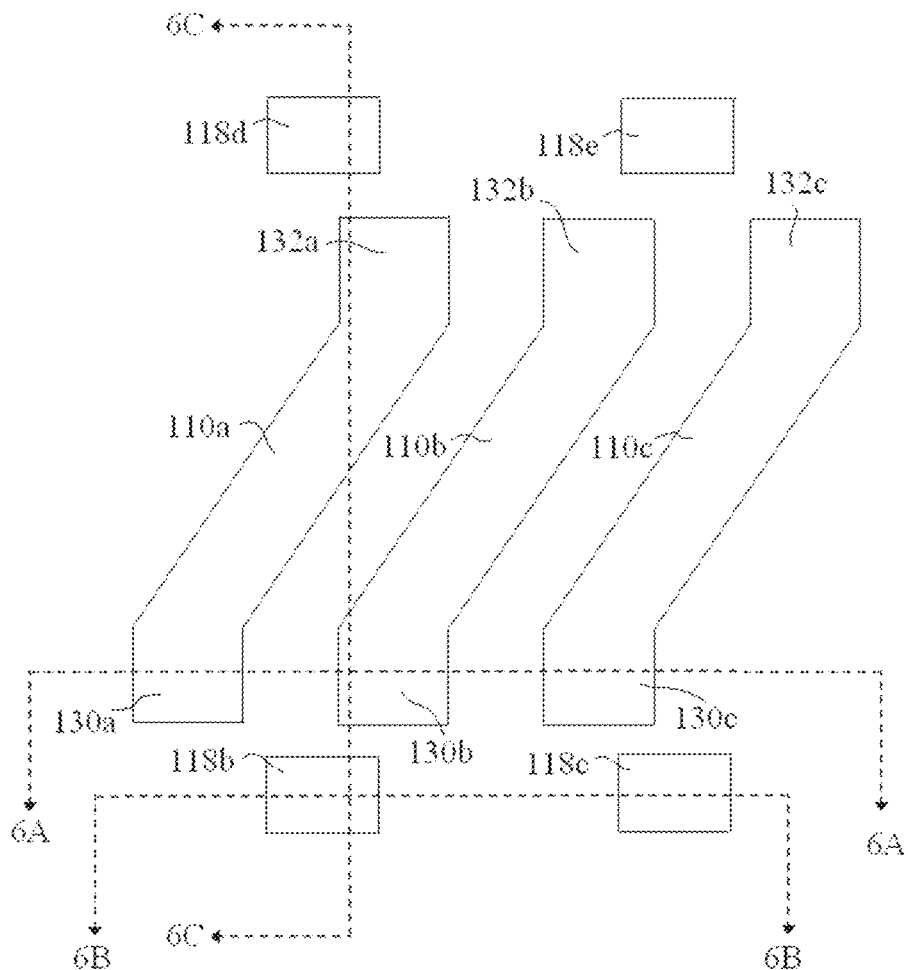
Figure 6F:
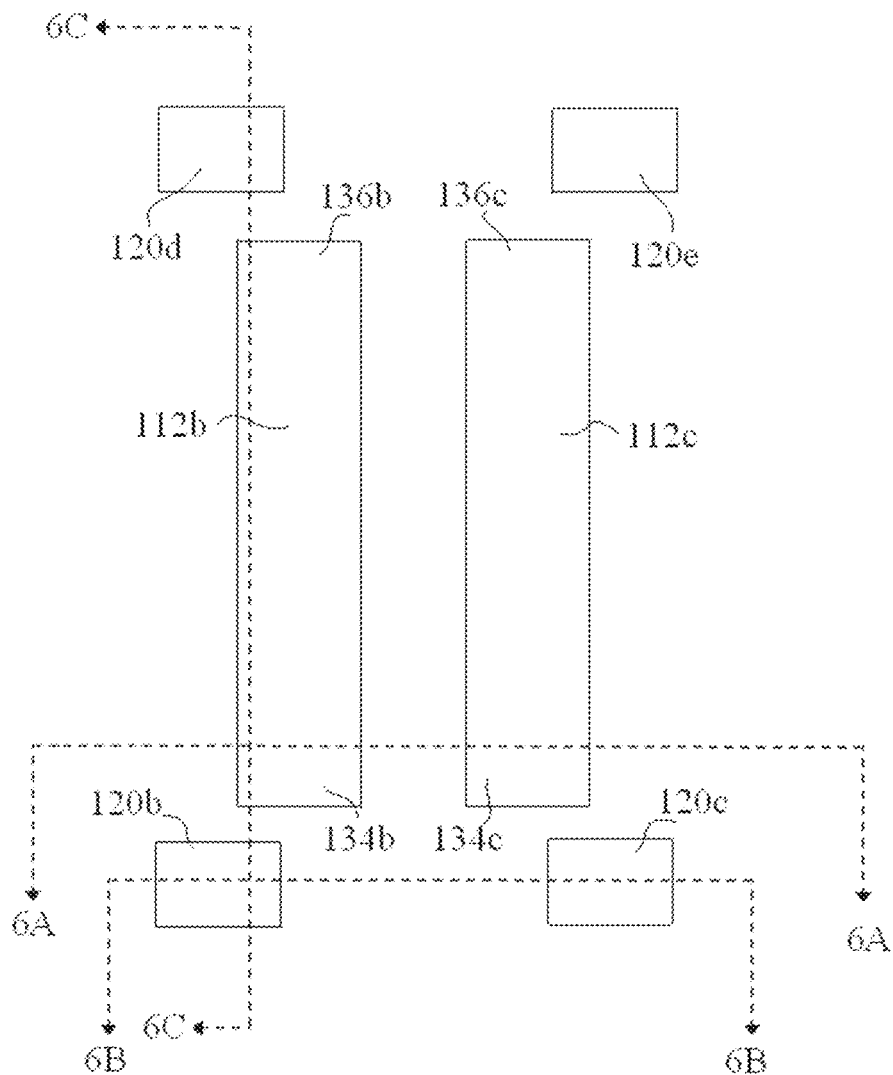
Figure 6G:
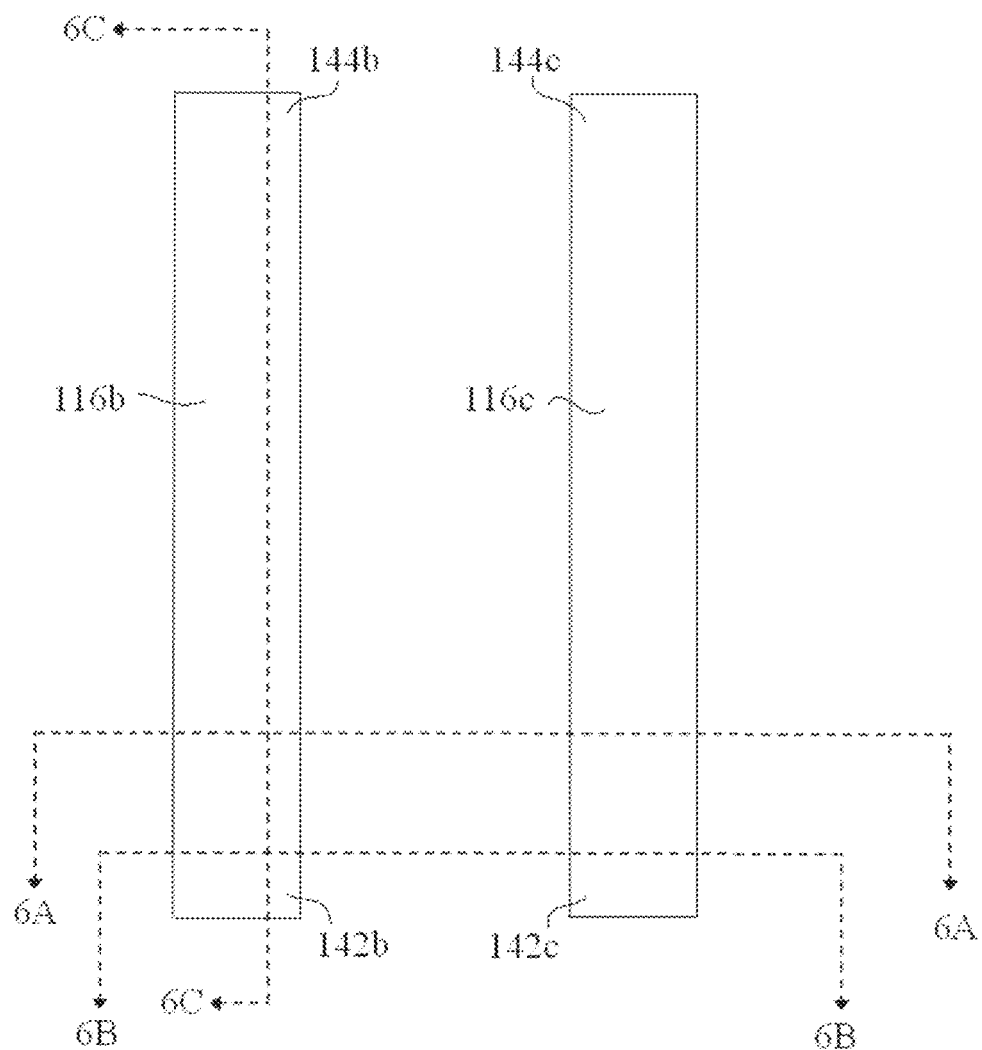
Figure 6H:
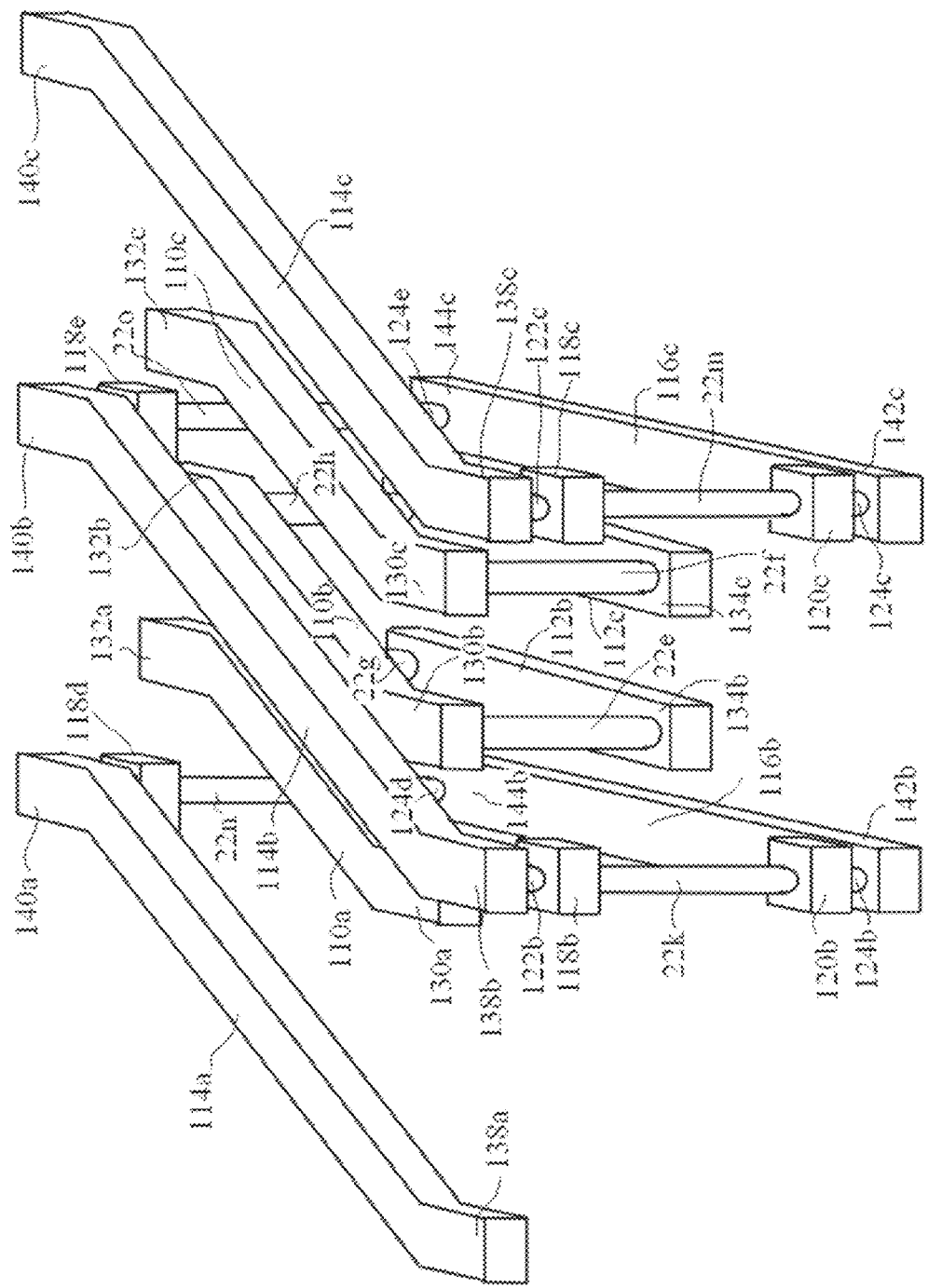

FIGS. 6A through 6C illustrate various cross-section views of a portion of a 3-D structure illustrated in FIG. 1 in accordance with a further embodiment that comprises a coil, inductor, and/or transformer. FIGS. 6A through 6H may be referenced between descriptions of each other for a clearer understanding. FIG. 6H is a simplified 3-D view of the portion of the 3-D structure, and FIGS. 6A through 6G are various 2-D views. In particular, FIG. 6D is a plan view of a second conductive pattern 114 in the second front-side metallization layer 106, and FIG. 6G is a plan view of a fourth conductive pattern 116 in the second back-side metallization layer 108. The conductive patterns in FIGS. 6D and 6G form a portion of an outer coil. FIG. 6E is a plan view of a first conductive pattern 110 and contact pads 118 in the first front-side metallization layer 102, and FIG. 6F is a plan view of a third conductive pattern 112 and contact pads 120 in the first back-side metallization layer 104. The conductive patterns in FIGS. 6E and 6F form a portion of an inner coil. FIGS. 6A, 6B, and 6C are each a cross-sectional view taken along the lines 6A-6A, 6B-6B, and 6C-6C, respectively, illustrated in FIGS. 6D through 6G. Further, like reference numerals in FIGS. 6A through 6H refer to the same components.

With reference to FIG. 6A, there is shown a substrate 100 of the interposer 14. While the substrate may be any material, in this embodiment, the substrate 100 may be silicon, where the first integrated circuit die 12 and the second integrated circuit die 16 are formed from silicon. It should be noted that the material of the substrate 100 may be the same material from which any of the integrated circuit dice are formed to reduce coefficient of thermal expansion (CTE) mismatch. A first front-side metallization layer 102 is over the front surface of the substrate 100, and a second front-side metallization layer 106 is over the first front-side metallization layer 102. A first back-side metallization layer 104 is on the back surface of the substrate 100, and a second back-side metallization layer 108 is on the first back-side metallization layer 104. The metallization layers may be any dielectric material, for example, BPSG, silicon oxide, silicon nitride, silicon oxynitride, USG, combinations thereof, and the like.

First trace links 110a, 110b, and 110c (collectively referenced as "first conductive pattern 110") are patterned and formed in the first front-side metallization layer 102, and second trace links 114a, 114b, and 114c (collectively referenced as "second conductive pattern 114") are patterned and formed in the second front-side metallization layer 106. Third trace links 112b and 112c (collectively referenced as "third conductive pattern 112") are patterned and formed in the first back-side metallization layer 104, and fourth trace links 116b and 116c (collectively referenced as "fourth conductive pattern 116") are patterned and formed in the second back-side metallization layer 108. Conductive patterns 110, 112, 114, and 116 may comprise a metal(s), such as copper, nickel, aluminum, tungsten, titanium, combinations thereof, or the like. TSV 22e penetrates through the substrate 100 to couple first trace link 110b to third trace link 112b, and TSV 22f penetrates through the substrate 100 to couple first trace link 110c to third trace link 112c.

In the view of FIG. 6B, it is shown that contact pads 118b and 118c (collectively referenced as 118) are formed in the first front-side metallization layer 102, and that contact pads 120b and 120c (collectively referenced as 120) are formed in the first back-side metallization layer 104. Contact pads 118 and 120 may be the same material as the first conductive pattern 110 and the third conductive pattern 112, respectively. Second trace link 114*b* is coupled to contact pad 118*b* by a via 122*b* in the second front-side metallization layer 106. TSV 22*k* penetrates through the substrate 100 to couple the contact pad 118*b* to contact pad 120*b*. The contact pad 120*b* is coupled to fourth trace link 116*b* by a via 124*b* in the second back-side metallization layer 108. Similarly, second trace link 114*c*, via 122*c*, contact pad 118*c*, TSV 22*m*, contact pad 120*c*, via 124*c*, and fourth trace link 116*c* are electrically coupled together.

With reference to FIG. 6C, there is further shown a via 122*d*, a contact pad 118*d*, TSVs 22*g* and 22*n*, a contact pad 120*d*, and a via 124*d*. The via 122*d* is in the second front-side metallization layer 106 and couples second trace link 114*a* to the contact pad 118*d* in the first front-side metallization layer 102. The TSV 22*n* penetrates through the substrate 100 to couple the contact pad 118*d* to the contact pad 120*d* in the first back-side metallization layer 104. The via 124*d* is in the second back-side metallization layer 108 and couples fourth trace link 116*a* to the contact pad 120*d*. The TSV 22*g* couples first trace link 110*a* to third trace link 112*b*.

FIG. 6D illustrates a plan view of the second conductive pattern 114 in the second front-side metallization layer 106. The second trace links 114*a*, 114*b*, and 114*c* each extend longitudinally in two directions. For example, second trace link 114*a* extends substantially only in one first direction near the opposing ends 138*a* and 140*a* of the second trace link 114*a*, but extend in a direction angled from the first direction in a second direction in other areas of the second trace link 114*a*. Second trace links 114*b* and 114*c* are similarly patterned with opposing ends 138*b*, 138*c*, 140*b*, and 140*c*. Second trace links 114*a*, 114*b*, and 114*c* each may be a transverse link of the outer coil, as discussed in more detail with respect to FIG. 6H.

FIG. 6E illustrates a plan view of the first conductive pattern 110 and contact pads 118 in the first front-side metallization layer 102. Similar to the second conductive pattern 114 in FIG. 6D, the first trace links 110*a*, 110*b*, and 110*c* each extend longitudinally in two directions, with opposing ends 130*a*, 130*b*, 130*c*, 132*a*, 132*b*, and 132*c*. Contact pads 118 lie outside of the area where the first conductive pattern 110 is formed. Contact pad 118*b* is aligned under end 138*b* of second trace link 114*b*, and contact pad 118*c* is aligned under end 138*c* of second trace link 114*c*. Contact pad 118*d* is aligned under end 140*a* of second trace link 114*a*, and contact pad 118*e* is aligned under end 140*b* of the second trace link 114*b*. First trace links 110*a*, 110*b*, and 110*c* each may be a transverse link of the inner coil, as discussed in more detail with respect to FIG. 6H.

FIG. 6F illustrates a plan view of the third conductive pattern 112 and contact pads 120 in the first back-side metallization layer 104. The third trace links 112*b* and 112*c* each extend longitudinally in the same first direction as the ends 138 and 140 of the second conductive pattern 114 in FIG. 6D and the ends 130 and 132 of the first conductive pattern 110 in FIG. 6E. Third trace links 112*b* and 112*c* comprise ends 134*b* and 136*b*, and 134*c* and 136*c*, respectively. Contact pads 120 lie outside of the area where the third conductive pattern 112 is located and are aligned as discussed with reference to FIG. 6G. Third trace links 112*b* and 112*c* each may be a straight link of the inner coil.

FIG. 6G illustrates a plan view of the fourth conductive pattern 116 in the second back-side metallization layer 108. Fourth trace links 116*b* and 116*c* each extend longitudinally in the same first direction as the third trace links 112*b* and 112*c* in FIG. 6F. Fourth trace links 116*b* and 116*c* comprise ends 142*b* and 144*b*, and 142*c* and 144*c*, respectively. Contact pad 120*b* in FIG. 6F is aligned with end 142*b* of fourth trace link 116*b*, and contact pad 120*c* is aligned with end 142*c* of fourth trace link 116*c*. Contact pad 120*d* is aligned with end 144*b* of fourth trace link 116*b*, and contact pad 120*e* is aligned with end 144*c* of fourth trace link 116*c*. Fourth trace links 116*b* and 116*c* each may be a straight link of the outer coil.

FIG. 6H is a 3-D view of the structure of the conductive materials, TSVs, contact pads, and vias. The structure comprises two coils—an inner coil and an outer coil. The outer coil will be described first. End 138*a* of second trace link 114*a* may be electrically coupled to other structures, such as an interconnect structure, a via, a TSV, the integrated circuit dies, or the like. End 140*a* of the second trace link 114*a* is coupled to via 122*d* (not shown), which is coupled to contact pad 118*d*. Contact pad 118*d* is coupled to contact pad 120*d* (not shown) by TSV 22*n*. Contact pad 120*d* is coupled to end 144*b* of fourth trace link 116*b* by via 124*d*. End 142*b* of the fourth trace link 116*b* is coupled to contact pad 120*b* by via 124*b*. Contact pad 120*b* is coupled to contact pad 118*b* by TSV 22*k*. Contact pad 118*b* is coupled to end 138*b* of second trace link 114*b* by via 122*b*. End 140*b* of the second trace link 114*b* is coupled to via 122*e* (not shown), which is coupled to contact pad 118*e*. Contact pad 118*e* is coupled to contact pad 120*e* (not shown) by TSV 22*o*. Contact pad 120*e* (not shown) is coupled to end 144*c* of fourth trace link 116*c* by via 124*e*. End 142*c* of the fourth trace link 116*c* is coupled to contact pad 120*c* by via 124*c*. Contact pad 120*c* is coupled to contact pad 118*c* by TSV 22*m*. Contact pad 118*c* is coupled to end 138*c* of second trace link 114*c* by via 122*c*. End 140*c* of the second trace link 114*c* may be electrically coupled to other structures, such as an interconnect structure, a via, a TSV, the integrated circuit dies, or the like. As can be seen from FIG. 6H, second trace links 114*a*, 114*b*, and 114*c* each extend in a second direction such that each may couple a respective pair of adjacent, parallel fourth trace links 116*b* and 116*c*. Thus, the second trace links 114*a*, 114*b*, and 114*c* each may be considered a transverse link.

The inner coil will now be described. End 130*a* of first trace link 110*a* may be electrically coupled to other structures, such as an interconnect structure, a via, a TSV, the integrated circuit dies, or the like. End 132*a* of the first trace link 110*a* is coupled to end 136*b* of third trace link 112*b* by TSV 22*g*. End 134*b* of the third trace link 112*b* is coupled to end 130*b* of first trace link 110*b* by TSV 22*e*. End 132*b* of the first trace link 110*b* is coupled to end 136*c* (not shown) of third trace link 112*c* by TSV 22*h*. End 134*c* of the third trace link 112*c* is coupled to end 130*c* of first trace link 110*c* by TSV 22*f*. End 132*c* of the first trace link 110*c* may be electrically coupled to other structures, such as an interconnect structure, a via, a TSV, the integrated circuit dies, or the like. As can be seen from FIG. 6H, first trace links 110*a*, 110*b*, and 110*c* each extend in a second direction such that each may couple a respective pair of adjacent, parallel third trace links 112*b* and 112*c*. Thus, the first trace links 110*a*, 110*b*, and 110*c* each may be considered a transverse link.

Figure 7A:
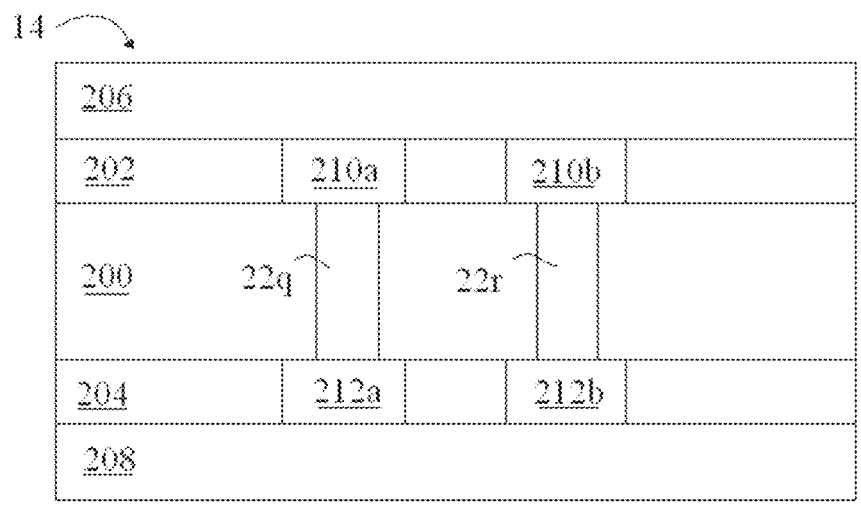
FIGS. 7A through 7D illustrate various views of a portion of a 3-D structure in accordance with a yet further embodiment.
Figure 7B:
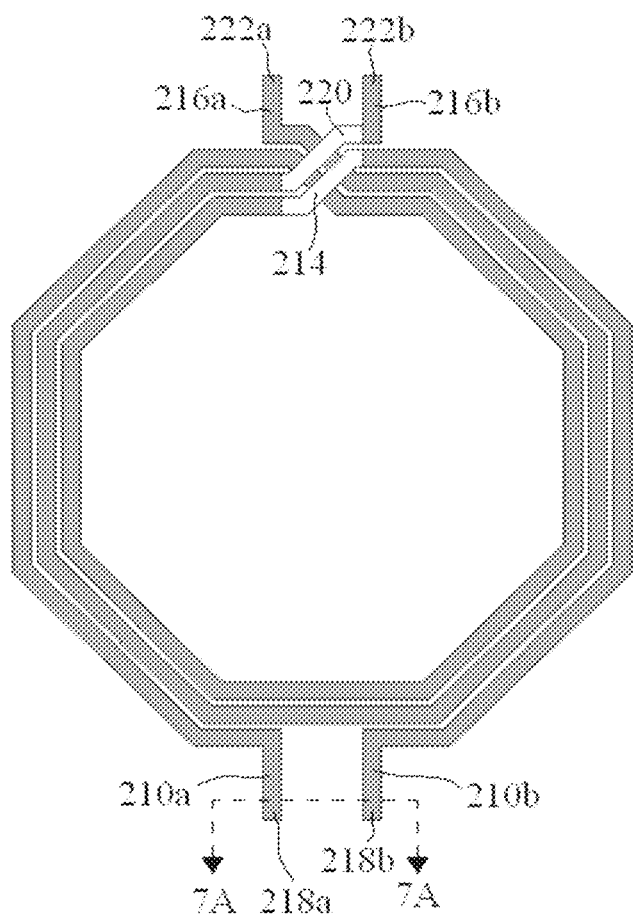
Figure 7C:
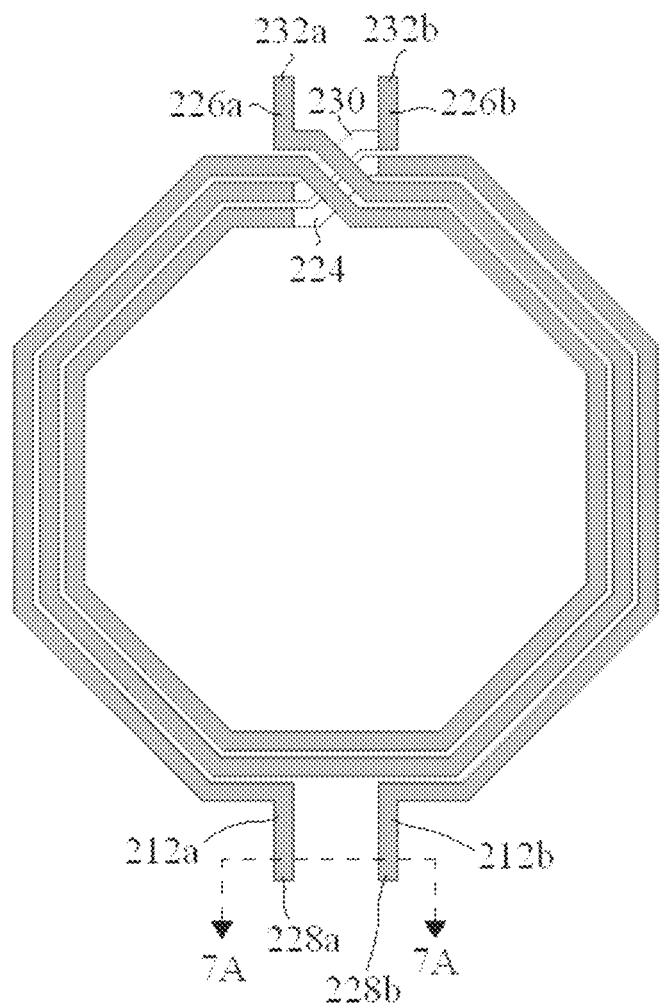
Figure 7D:
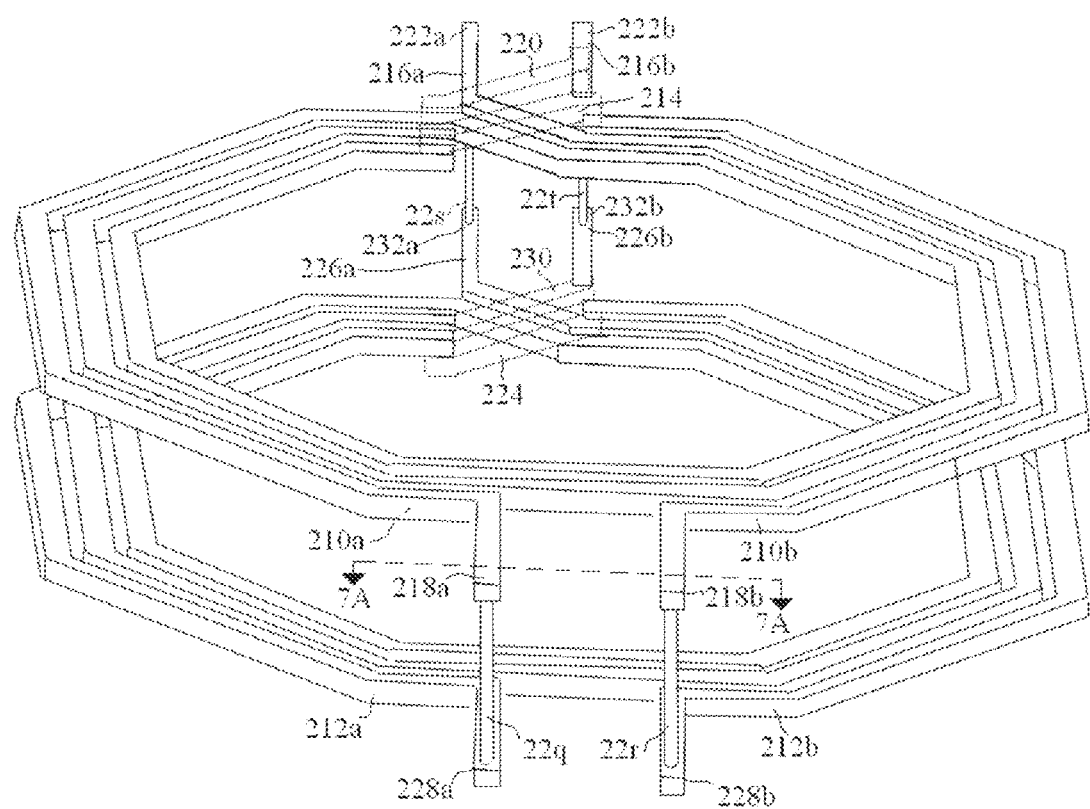

FIGS. 7A through 7D illustrate various views of a portion of a 3-D structure illustrated in FIG. 1 in accordance with a yet further embodiment that comprises a coil, inductor, and/or transformer. FIGS. 7A through 7D may be referenced between each other for a clearer understanding. FIG. 7D is a simplified 3-D view of the portion of the 3-D structure, and FIGS. 7A through 7C are various 2-D views. In particular, FIG. 7B is a plan view of conductive patterns in the first and second front-side metallization layers 202 and 206, and FIG. 7C is a plan view of conductive patterns in the first and second back-side metallization layers 204 and 208. FIG. 7A is a cross-sectional view taken along the 7A-7A line illustrated in FIGS. 7B through 7D. Further, like reference numerals in FIGS. 7A through 7D refer to the same components.

FIG. 7A illustrates a cross-section view of a portion of a 3-D structure illustrated in FIG. 1. FIG. 7A shows a substrate 200 with a first front-side metallization layer 202 formed on a front surface of the substrate 200, and a second front-side metallization layer 206 formed on the first front-side metallization layer 202. A first back-side metallization layer 204 is formed on the a second surface of the substrate 200 opposite from the first, and a second back-side metallization layer 208 is formed on the first back-side metallization layer 204. Parts of a first spiral 210a and 210b (collectively referenced as "first spiral pattern 210") are in the first front-side metallization layer 202, and parts of a third spiral 212a and 212b (collectively referenced as "third spiral pattern 212") are in the first back-side metallization layer 204. TSV 22q may penetrate through the substrate 200 to couple the first part of the first spiral 210a to the first part of the third spiral 212a, and TSV 22r may penetrate through the substrate 200 to couple the second part of the first spiral 210b to the second part of the third spiral 212b.

FIG. 7B illustrates the first spiral pattern 210, parts of a second spiral 216a and 216b (collectively referenced as "second spiral pattern 216"), and other patterns in the first and second front-side metallization layers 202 and 206. Line 7A-7A indicates the cross section view in FIG. 7A. End 218a of the first part of the first spiral 210a extends from the periphery of a ring formed by the first spiral pattern 210 and the second spiral pattern 216 (collective referenced as "first conductive pattern 210/216") in a direction perpendicular to the periphery. The first part of the first spiral 210a extends along half a circumference of an outer ring before it crosses into an inner ring where it extends along the entire circumference of the inner ring. At the completion of the inner ring, the first part of the first spiral 210a is coupled to a cross link 214. (See FIG. 7D for a 3-D view of cross link 214.) Cross link 214 is in the second front-side metallization layer 206 and may comprise a via coupled to the first part of the first spiral 210a, a metal line coupled to the via, and another via coupled to the metal line and the second part of the first spiral 210b. The second part of the first spiral 210b then extends from the crossover point around the second half of the circumference of the outer ring until it extends perpendicularly from the periphery at end 218b near end 218a.

FIG. 7B further illustrates parts of the second spiral 216a and 216b. At end 222a, the first part of the second spiral 216a extends perpendicularly from the periphery of the outer ring opposite from where the first spiral pattern 210 extends perpendicularly. The first part of the second spiral 216a then extends in an intermediate ring and around the circumference of the intermediate ring. At the crossover point, the first part of the second spiral 216a is coupled to a cross link 220 in the second front-side metallization layer 206. (See FIG. 7D for a 3-D view of cross link 220.) Cross link 220 may be similar to cross link 214. Cross link 220 is then coupled to end 222b of the second part of the second spiral 216b, which extends perpendicularly from the periphery of the outer ring near end 222a.

FIG. 7C illustrates the third spiral pattern 212, parts of a fourth spiral 226a and 226b (collectively referenced as "fourth spiral pattern 226"), and other patterns in the first and second back-side metallization layers 204 and 208. Line 7A-7A indicates the cross section view in FIG. 7A. The first and second parts of the third spiral 212a and 212b with ends 228a and 228b, respectively, extending perpendicularly from the periphery of the third spiral pattern 212 and the fourth spiral pattern 226 (collective referenced as "second conductive pattern 212/226"), and the first and second parts of the fourth spiral 226a and 226b with ends 232a and 232b, respectively, extending perpendicularly from the periphery second conductive pattern 212/226, are similar to that of the first and second spiral patterns 210 and 216 in FIG. 7B. Cross link 224 couples the first part of the third spiral 212a to the second part of the third spiral 212b, and cross link 230 couples the first part of the fourth spiral 226a to the second part of the fourth spiral 226b. Cross link 224 and cross link 230 are formed in the second back-side metallization layer 208. (See FIG. 7D for a 3-D view of cross links 224 and 230.)

FIG. 7D illustrates a 3-D view of the first and second conductive patterns 210/216 and 212/226, cross links 214, 220, 224, and 230, and possible TSVs. In this configuration, TSV 22q may couple the first part of the first spiral 210a at end 218a to the first part of the third spiral 212a at end 228a, and TSV 22r may couple the second part of the first spiral 210b at end 218b to the second part of the third spiral 212b at end 228b. Similarly, TSV 22s may couple the first part of the second spiral 216a at end 222a to the first part of the fourth spiral 226a at end 232a, and TSV 22t may couple the second part of the second spiral 216b at end 222b to the second part of the fourth spiral 226b at end 232b. It may not be desirable to have TSVs 22q, 22r, 22s, and 22t all present. One configuration may include TSVs 22r and 22s but not TSVs 22q and 22t, and another configuration may include TSVs 22q and 22t but not TSVs 22r and 22s. Any of the ends of the spirals may be electrically coupled to other structures, such as an interconnect structure, a via, a TSV, the integrated circuit dies, or the like.

The structures in FIGS. 6A through 7D may therefore form transformers. Inductors may be used to form these transformers and may be formed on metallization layers on an interposer using a TSV as a part of the inductor coil. Using these configurations may result in an inductor that may otherwise require a larger area to be formed on the integrated circuit die. Further, using the embodiment in FIGS. 6A through 6H, the magnetic flux produced by the inductors may be directed more in a direction parallel to the outer surface of the integrated circuit die on which the conductive blimps are formed, thus, reducing the magnetic flux penetrating the integrated circuit die substrate. This may reduce parasitic coupling between other devices and components on the integrated circuit die. Using the configuration in FIGS. 7A through 7D may also reduce parasitic coupling because the inductors may be further removed from other devices and components on the integrated circuit die. Another advantage of these embodiments may be that the size of the conductive materials used on the interposer may be larger and may be thicker than metals used in metallization layers on an integrated circuit die, for example the conductive materials may be 9K metal layers. Thus, these embodiments may realize a higher quality (Q) factor. Also, these embodiments may be formed more cheaply.

Figure 8:
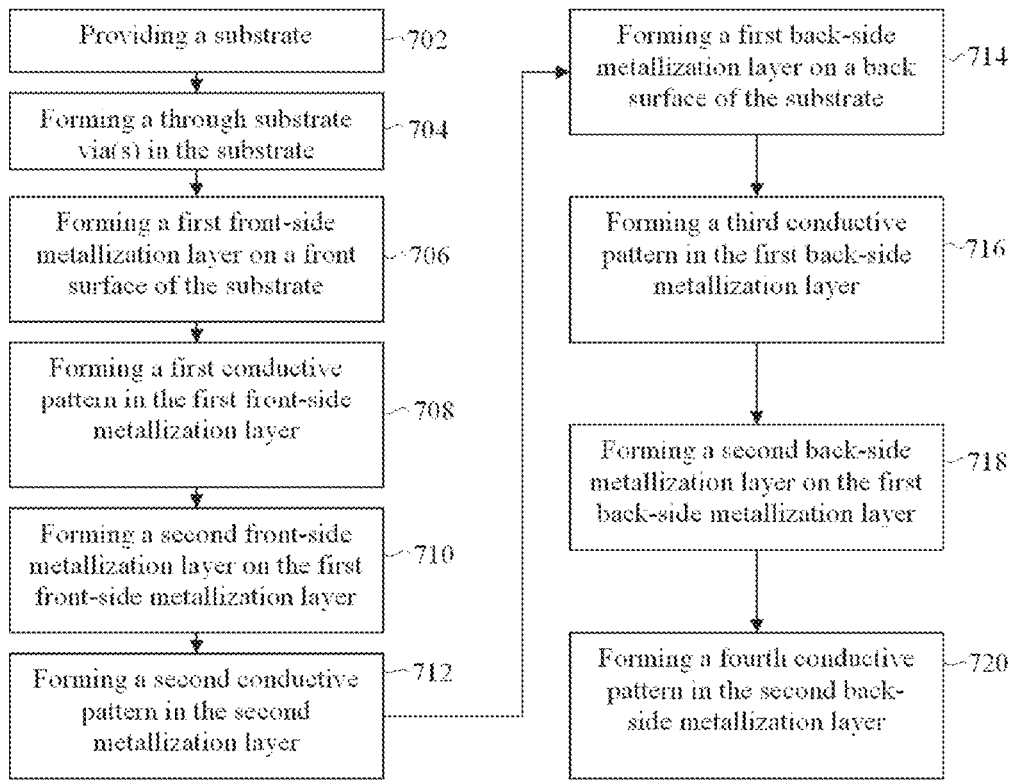
FIG. 8 is a method of forming the embodiments of FIGS. 6A through 7D according to an embodiment.

FIG. 8 is a method of forming the embodiments of FIGS. 6A through 6H and FIGS. 7A through 7D. The steps discussed with regard to FIG. 8 may be performed in any order, and any sequence discussed herein is only for clarification of the embodiment.

In step 702, a substrate is provided. This substrate may be a bulk silicon substrate or the like. In step 704, TSVs are formed in the substrate. For example, openings may be formed extending into the substrate by, for example, one or more etching processes, milling, laser techniques, or the like through a front surface of the substrate. The openings may be filled with a conductive material. The conductive material may comprise, for example, copper, tungsten, aluminum, silver, combinations thereof, or the like, formed by an electrochemical plating process, thereby forming the through substrate vias.

In step 706, a first front-side metallization layer is formed on the front surface of the substrate. The first front-side metallization layer may be a dielectric, such as BPSG, silicon oxide, silicon nitride, silicon oxynitride, USG, or the like, and may be formed using a CVD technique. It should be noted that the front-side metallization layer may be formed adjoining the substrate, or other layers, such as other metallization layers, may be disposed between the substrate and the first front-side metallization layer. In step 708, a first conductive pattern, such as illustrated in FIG. 6E as the first conductive pattern 110 and contact pads 118 or in FIG. 7B as the first conductive pattern 210/216, is formed in the first front-side metallization layer. The pattern may be formed by using standard lithography and deposition techniques. A damascene or dual damascene process may be used. A photoresist may be formed over the metallization layer and patterned using a lithography mask. An etch may be used to form openings in the metallization layer. A conductive material may be deposited in the openings using, for example, a CVD technique. The conductive material may be copper, nickel, aluminum, tungsten, titanium, combinations thereof, and/or the like. Any excess conductive material may be removed and the metallization layer may be planarized using a CMP. A portion of the conductive material may be electrically coupled to a TSV formed in step 704.

In step 710, similar to step 706, a second front-side metallization layer is formed on the first front-side metallization layer. In step 712, similar to step 708, a second conductive pattern, such as illustrated in FIG. 6D as second conductive pattern 114 or in FIG. 7B as cross links 214 and 220, is formed in the second front-side metallization layer. Portions of the second conductive pattern in the second front-side metallization layer may electrically couple portions of the first conductive pattern in the first front-side metallization layer.

Other layers, such as more metallization layers, may be formed on the second front-side metallization layer. Further details of additional processing regarding the front-side of the substrate may be readily understood by a person having ordinary skill in the art and are therefore omitted herein.

In some instances, the back-side of the substrate may require thinning to expose the TSVs through the back surface. This may be accomplished using an etching and/or planarization process, such as a CMP process. For example, initially a CMP may be performed to initially expose a portion of the TSVs. Thereafter, one or more wet etching processes having a high etch rate selectivity may be performed, thereby leaving the TSVs protruding from the backside of the substrate.

In step 714, a first back-side metallization layer is formed on the back surface of the substrate. The first back-side metallization layer may be a dielectric, such as BPSG, silicon oxide, silicon nitride, silicon oxynitride, USG, or the like, and may be formed using a CVD technique. It should be noted that the first back-side metallization layer may be formed adjoining the substrate, or other layers, such as other metallization layers, may be disposed between the substrate and the first back-side metallization layer. In step 716, a third conductive pattern, such as illustrated in FIG. 6F as the third conductive pattern 112 and contact pads 120 or in FIG. 7C as the second conductive pattern 212/226, is formed in the first back-side metallization layer. The pattern may be formed by using standard lithography and deposition techniques. A damascene or dual damascene process may be used. A photoresist may be formed over the metallization layer and patterned using a lithography mask. An etch may be used to form openings in the metallization layer. A conductive material may be deposited in the openings using, for example, a CVD technique. The conductive material may be copper, nickel, aluminum, tungsten, titanium, combinations thereof, and/or the like. Any excess conductive material may be removed, and the metallization layer may be planarized using a CMP. A portion of the third conductive pattern may be electrically coupled to a TSV formed in step 704.

In step 718, similar to step 714, a second back-side metallization layer is formed on the first back-side metallization layer. In step 720, similar to step 716, a fourth conductive pattern, such as illustrated in FIG. 6G as the fourth conductive pattern 116 or in FIG. 7C as cross links 224 and 230, is formed in the second back-side metallization layer. Portions of the fourth conductive pattern in the second back-side metallization layer may electrically couple portions of the third conductive pattern in the first back-side metallization layer.

Other layers, such as more metallization layers, may be formed on the second back-side metallization layer. Further details of additional processing regarding the back-side of the substrate may be readily understood by a person having ordinary skill in the art, and therefore, such details are omitted herein.

Other embodiments contemplate a combination of features of FIGS. 2A through 3D and FIGS. 6A through 7D. Note that any layer or conductive pattern or other features that are described as formed in a particular metallization layer may be formed in any metallization layer, such as a metallization layer on either the first or second integrated circuit die 12 or 16 or a metallization layer on the interposer 14. Accordingly, any combination or selection of conductive bumps, TSVs, or vias may be used in forming the inductors and/or transformers. FIGS. 9A, 9B, 10A, and 10B briefly illustrate two further embodiments that combine some of these features.

Figure 9A:
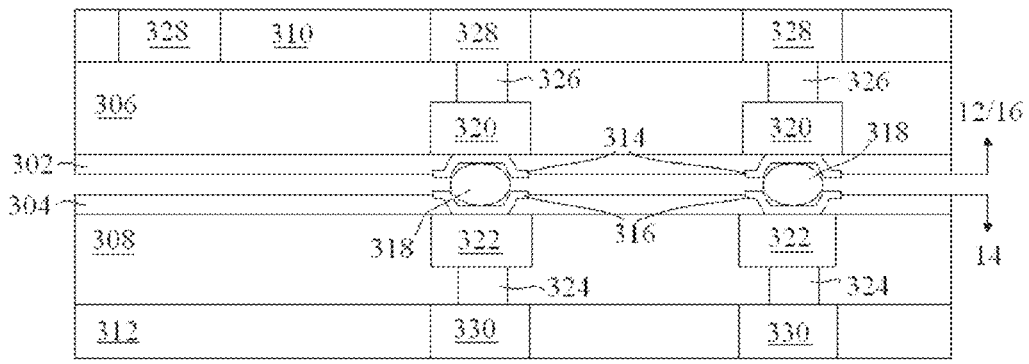
FIGS. 9A and 9B illustrate various views of a portion of a 3-D structure in accordance with a yet another embodiment.
Figure 9B:
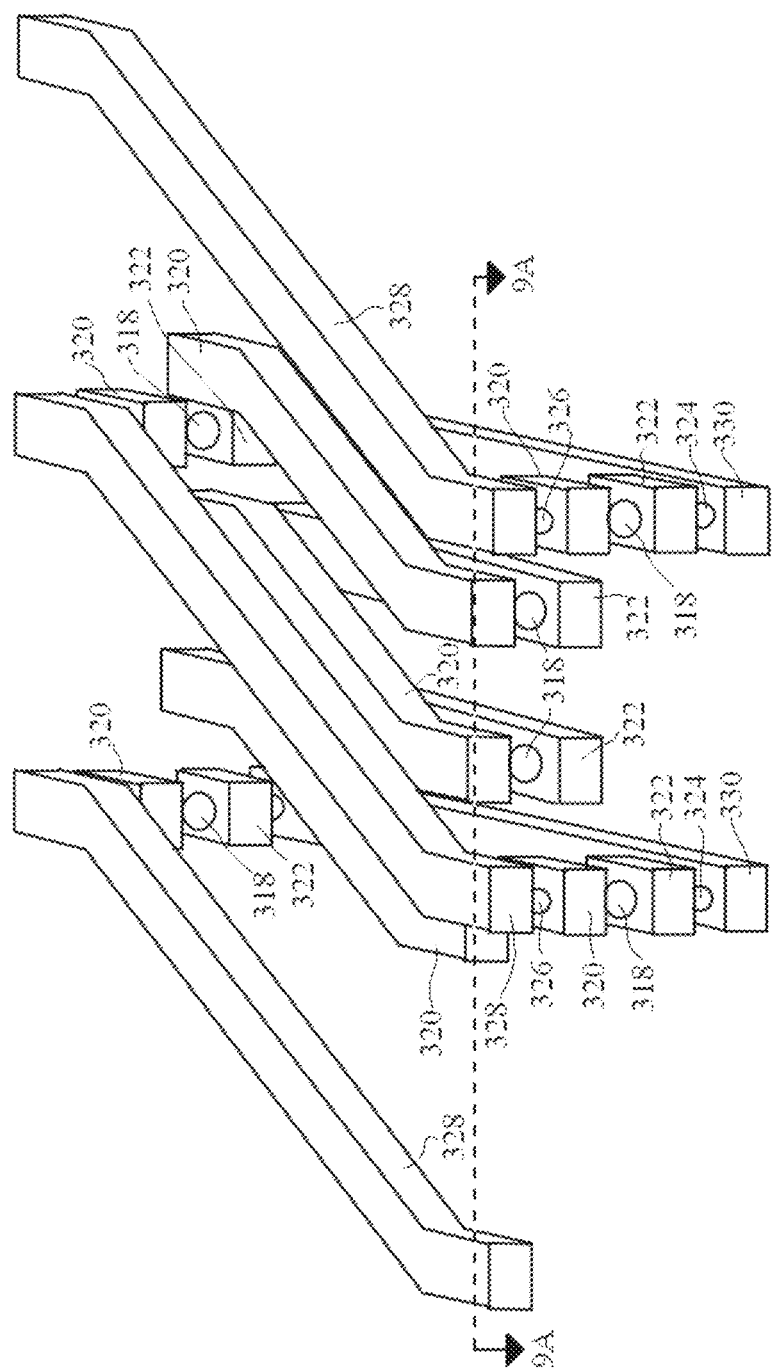

FIGS. 9A and 9B show another embodiment incorporating different features of the above embodiments and illustrate a structure using conductive bumps 318 to form an inductor and/or transformer. FIG. 9A is a cross section view, and FIG. 9B is a simplified 3-D view. Line 9A-9A in FIG. 9B illustrates the cross section view in FIG. 9B. In integrated circuit die 12/16 is a first metallization layer 310, a second metallization layer 306 on the first metallization layer 310, and a passivation layer 302 on the second metallization layer 306. Underbump pads 314 contact portions of a first conductive pattern 320 in the second metallization layer 306. Vias 326 couple the portions of the first conductive pattern 320 to portions of a second conductive pattern 328 in the first metallization layer 310. In the interposer 14 is a first front-side metallization layer 312, a second front-side metallization layer 308 on the first front side metallization layer 312, and a passivation layer 304 on the second front-side metallization layer 308. Underbump pads 316 are formed to contact portions of a third conductive pattern 322 in the second front-side metallization layer 308. Vias 324 couple the portions of the third conductive pattern 322 to portions of a fourth conductive pattern 330 in the first front-side metallization layer 312. Conductive bumps 318 are physically and electrically coupled to the underbump pads 314 and 316.

Figure 10A:
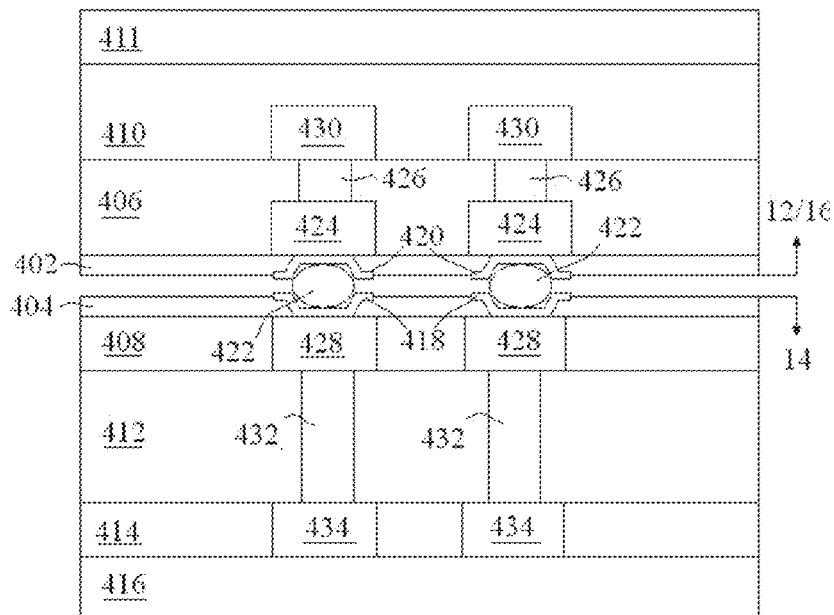
FIGS. 10A and 10B illustrate various views of a portion of a 3-D structure accordance with a yet additional embodiment.
Figure 10B:
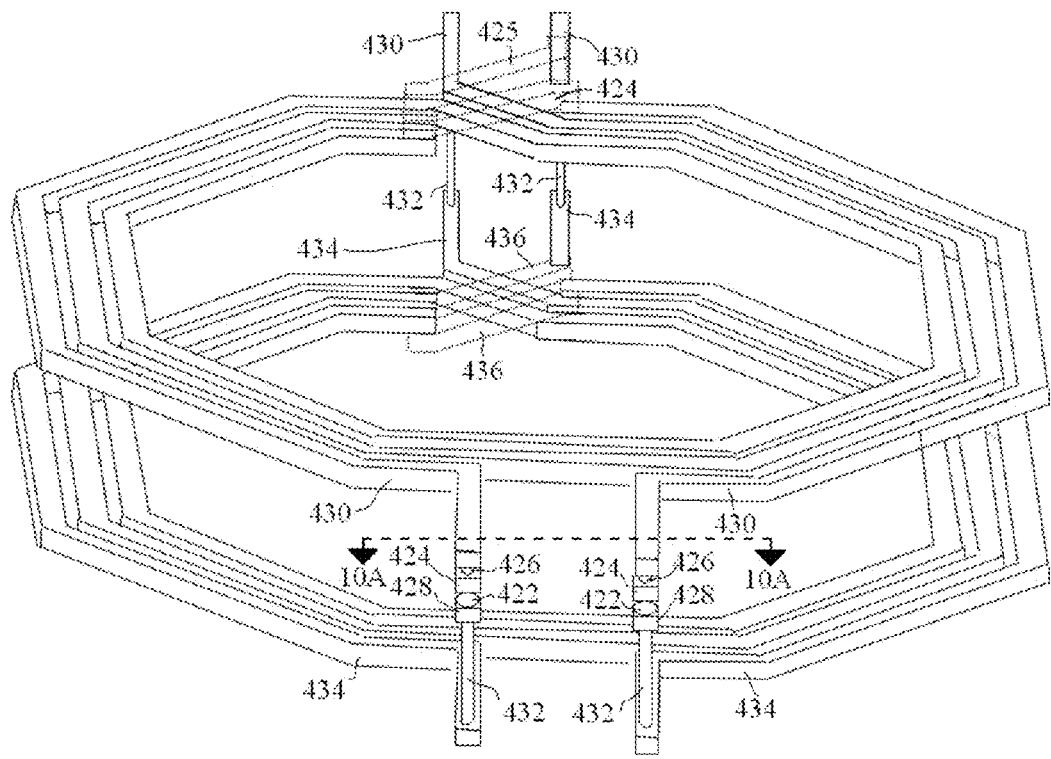

FIGS. 10A and 10B show an even further embodiment incorporating different features of the above embodiments and illustrate a structure using TSVs 432, vias 426, and conductive bumps 422 to form an inductor and/or transformer. FIG. 10A is a cross section view, and FIG. 10B is a simplified 3-D view. Line 10A-10A in FIG. 10B illustrates the cross section view in FIG. 10B. In integrated circuit die 12/16 is a first metallization layer 411, a second metallization layer 410 on the first metallization layer 411, a third metallization layer 406 on the second metallization layer 410, and a passivation layer 402 on the third metallization layer 406. Underbump pads 420 are formed to couple contact pads 424 in the third metallization layer 406. Vias 426 couple contact pads 424 to portions of a first conductive pattern 430 in the second metallization layer 410. A second conductive pattern 425 is in the first metallization layer 411 coupled to portions of the first conductive pattern 430, as shown in FIG. 10B.

In the interposer 14 is a front-side metallization layer 408 on a front surface of a substrate 412, a passivation layer 404 on the front-side metallization layer 408, a first back-side metallization layer 414 on the back surface of the substrate 412, and a second back-side metallization layer 416 on the first back-side metallization layer 414. Underbump pads 418 are formed to couple contact pads 428 in the front-side metallization layer 408. TSVs 432 couple the contact pads 428 to portions of a third conductive pattern 434 in the first back-side metallization layer 414. A fourth conductive pattern 436 is in the second back-side metallization layer 414 coupled to portions of the third conductive pattern 434, as shown in FIG. 10B. Conductive bumps 422 are physically and electrically coupled to the underbump pads 418 and 420.

In accordance with an embodiment, a semiconductor device comprises a semiconductor die, an interposer, and conductive bumps bonding the semiconductor die to the interposer. The semiconductor die comprises a first metallization layer, and the first metallization layer comprises a first conductive pattern. The interposer comprises a second metallization layer, and the second metallization layer comprises a second conductive pattern. Some of the conductive bumps electrically couple the first conductive pattern to the second conductive pattern to form a coil.

Another embodiment is an interposer. The interposer comprises a substrate, a first metallization layer on a first side of the substrate, a second metallization layer on the first metallization layer, a third metallization layer on a second side of the substrate, a fourth metallization layer on the third metallization layer, and through substrate vias (TSVs) extending through the substrate. The first metallization layer comprises a first conductive pattern, and the second metallization layer comprises a second conductive pattern. The second side is opposite the first side. The third metallization layer comprises a third conductive pattern, and the fourth metallization layer comprises a fourth conductive pattern. At least one TSV electrically couples one of the first conductive pattern and the second conductive pattern to one of the third conductive pattern and the fourth conductive pattern to form a first coil. At least one other TSV electrically couples one of the first conductive pattern and the second conductive pattern to one of the third conductive pattern and fourth conductive pattern to form a second coil.

A further embodiment is a method for forming a semiconductor device. The method comprises providing a semiconductor die, providing an interposer, and bonding the semiconductor die to the interposer using conductive bumps. The semiconductor die comprises a first substrate and a first dielectric layer over the first substrate, and the first dielectric layer has a first conductive pattern. The interposer comprises a second substrate and a second dielectric layer over the second substrate, and the second dielectric layer has a second conductive pattern. At least one of the conductive bumps electrically couples the first conductive pattern to the second conductive pattern to form a coil.

A yet further embodiment is a method for forming a semiconductor structure. The method comprises providing a substrate, forming through substrate vias (TSVs) extending through the substrate, forming a first dielectric layer on a first side of the substrate, forming a second dielectric layer on the first dielectric layer, forming a third dielectric layer on a second side of the substrate opposite the first side, and forming a fourth dielectric layer on the third dielectric layer. The first dielectric layer has a first conductive pattern, and the second dielectric layer has a second conductive pattern. The third dielectric layer has a third conductive pattern, and the fourth dielectric layer has a fourth conductive pattern. At least one TSV electrically couples one of the first conductive pattern and the second conductive pattern to one of the third conductive pattern and the fourth conductive pattern to form a first coil. At least one other TSV electrically couples one of the first conductive pattern and the second conductive pattern to one of the third conductive pattern and the fourth conductive pattern to form a second coil.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a semiconductor die comprising:
      a first metallization layer comprising a first conductive pattern; and
      a second metallization layer over the first metallization layer, the second metallization layer comprising a second conductive pattern;
   an interposer comprising:
      a third metallization layer on a first side of the interposer, the third metallization layer comprising a third conductive pattern; and
      a fourth metallization layer over the third metallization layer, the fourth metallization layer comprising a fourth conductive pattern; and
   a first set of conductive bumps bonding the semiconductor die to the interposer, at least one of the first set of conductive bumps electrically coupling one of the first conductive pattern and the second conductive pattern to one of the third conductive pattern and the fourth conductive pattern to form a first coil, and at least one other of the first set of conductive bumps electrically coupling one of the first conductive pattern and the second conductive pattern to one of the third conductive pattern and fourth conductive pattern to form a second coil, the first coil being distinct from the second coil.

2. The structure of claim 1 further comprising:
   a substrate; and
   a second set of conductive bumps on a second side of the interposer and bonding the interposer to the substrate, the second side being opposite the first side.

3. The structure of claim 2 further comprising:
a second integrated circuit die; and
a third set of conductive bumps on the second side of the interposer and bonding the second integrated circuit die to the interposer.

4. The structure of claim 1, wherein the semiconductor die further comprises a first dielectric layer, the first metallization layer being in the first dielectric layer, and wherein the interposer further comprises a second dielectric layer, the second metallization layer being in the second dielectric layer.

5. The structure of claim 1, wherein the first conductive pattern and the third conductive pattern each comprises a ring-shape of conductive materials.

6. The structure of claim 1, wherein the interposer further comprises a via electrically coupling the third conductive pattern to the fourth conductive pattern.

7. The structure of claim 1, wherein the semiconductor die further comprises a via electrically coupling the first conductive pattern to the second conductive pattern.

8. The structure of claim 1, wherein the second coil surrounds the first coil.

9. The structure of claim 1, wherein the first conductive pattern, the second conductive pattern, the third conductive pattern, and the fourth conductive pattern each comprises at least two trace links, wherein the at least two trace links of each of the first conductive pattern and the second conductive pattern has at least a first portion with a first longitudinal axis and at least a second portion with a second longitudinal axis, the second longitudinal axis being different than the first longitudinal axis.

10. A device comprising:
a semiconductor die comprising:
a first metallization layer comprising a first spiral pattern and a second spiral pattern, the second spiral pattern being distinct from the first spiral pattern, a first part of the first spiral pattern surrounding the second spiral pattern, and the second spiral pattern surrounding a second part of the first spiral pattern; and
a second metallization layer on the first metallization layer, the second metallization layer comprising a first cross link and a second cross link;
an interposer comprising:
a third metallization layer on a first side of a substrate, the third metallization layer comprising a third spiral pattern and a fourth spiral pattern, the fourth spiral pattern being distinct from the third spiral pattern;
a fourth metallization layer on the first side of the substrate comprising a third cross link and a fourth cross link; and
through substrate vias (TSVs) extending through the substrate; and
conductive bumps bonding the semiconductor die to a second side of the interposer, the second side being opposite the first side, the conductive bumps and the TSVs electrically coupling at least one of the first metallization layer and second metallization layer to at least one of the third metallization layer and the fourth metallization layer.

11. The device of claim 10, wherein the first cross link electrically couples a first portion of the first spiral pattern to a second portion of the first spiral pattern, and the second cross link electrically couples a first portion of the second spiral pattern to a second portion of the second spiral pattern.

12. The device of claim 11, wherein the first cross link further comprises:
a metal line in the second metallization layer;
a first via electrically coupling the first portion of the first spiral pattern to the metal line; and
a second via electrically coupling the second portion of the first spiral pattern to the metal line.

13. The device of claim 10, wherein a first part of the third spiral pattern surrounds the fourth spiral pattern, and the fourth spiral pattern surrounds a second part of the third spiral pattern.

14. The device of claim 10, wherein at least one TSV electrically couples the first spiral pattern to the third spiral pattern, and at least one other TSV electrically couples the second spiral pattern to the fourth spiral pattern.

15. The device of claim 10, wherein each of the TSVs have a first end and a second end, the first ends being coplanar with a first side of the substrate and the second ends being coplanar with the second side of the substrate, the first and second sides being major surfaces of the substrate.

16. A method comprising:
forming a plurality of through substrate vias (TSVs) extending through a substrate;
forming a first set of trace links on a first side of the substrate, the first set of trace links forming a first conductive pattern;
forming a second set of trace links over the first set of trace links, the second set of trace links forming a second conductive pattern;
forming a third set of trace links on a second side of the substrate, the second side being opposite the first side, the third set of trace links forming a third conductive pattern; and
forming a fourth set of trace links over the third set of trace links, the fourth set of trace links forming a fourth conductive pattern, at least one of the plurality of TSVs electrically coupling the first conductive pattern and the third conductive pattern to form a first coil, at least one other of the plurality of TSVs electrically coupling the second conductive pattern and the fourth conductive pattern to form a second coil, the first coil being distinct from the second coil.

17. The method of claim 16, wherein the first conductive pattern and the third conductive pattern each comprises a ring-shape of conductive materials.

18. The method of claim 16, wherein each of the first and third sets of trace links has at least a portion with a first longitudinal axis and at least a second portion with a second longitudinal axis, the second longitudinal axis being different than the first longitudinal axis.

19. The method of claim 16, wherein each of the plurality of TSVs having a first end and a second end, the first ends being coplanar with a first side of the substrate and the second ends being coplanar with the second side of the substrate, the first and second sides being major surfaces of the substrate.

20. The method of claim 16, wherein the second coil surrounds the first coil.

* * * * *